United States Patent [19]

McLean et al.

[11] Patent Number: 4,799,268
[45] Date of Patent: Jan. 17, 1989

[54] LEAD SENSE SYSTEM FOR COMPONENT INSERTION MACHINE

[75] Inventors: Jean A. McLean, So. Hamilton; Robert J. Duncan, Magnolia, both of Mass.

[73] Assignee: USM Corporation, Farmington, Conn.

[21] Appl. No.: 797,322

[22] Filed: Nov. 12, 1985

[51] Int. Cl.⁴ .............................. G06K 9/00
[52] U.S. Cl. ............................ 382/8; 382/34; 382/48; 358/101; 358/106; 250/561
[58] Field of Search ........... 250/561, 562; 356/375, 356/380, 398; 364/468, 478, 490; 358/101, 106, 107; 382/1, 8, 10, 53, 34, 48, 51, 52; 29/33 M, 739, 720, 721, 741

[56] References Cited

U.S. PATENT DOCUMENTS

| | | | |
|---|---|---|---|
| 4,162,481 | 7/1979 | DuVall | 382/52 |
| 4,450,579 | 5/1984 | Nakashima et al. | 356/375 |
| 4,472,056 | 9/1984 | Nakagawa et al. | 358/107 |
| 4,549,087 | 10/1985 | Duncan et al. | 250/561 |
| 4,553,843 | 11/1985 | Langley et al. | 250/561 |

Primary Examiner—Leo H. Boudreau
Assistant Examiner—Jose L. Couso
Attorney, Agent, or Firm—Spencer T. Smith

[57] ABSTRACT

A system is disclosed for verifying the proper insertion of the leads of an electrical component. The system includes a camera mounted within a component insertion machine. The camera image is stored within the system and analyzed for the absence of any leads that should have been inserted.

11 Claims, 28 Drawing Sheets

LEAD SENSE SYSTEM FOR COMPONENT INSERTION MACHINE

FIELD OF THE INVENTION

This invention relates to the inserting of leads of an electrical component into the holes of a printed circuit board. In particular, this invention relates to the sensing of the leads following their insertion into the holes of the printed circuit board.

BACKGROUND OF THE INVENTION

The sensing of leads of a component after the leads have been inserted into the holes of a printed circuit board is disclosed in U.S. Pat. No. 4,549,087 entitled "Lead Sensing System for Component Insertion Machine" issued on Oct. 22, 1985. The disclosed system is premised on sensing the presence or absence of inserted leads via a fiber optic sensor arrangement mounted within the cut and clinch mechanism of the component insertion machine.

Placing a lead sensing system into such a confined area imposes considerable restraints on the ability of the system to sense inserted leads. In this regard, the system disclosed in U.S. Pat. No. 4,549,087 includes both light projection as well as light sensing within this confined area. The light sensing portion of the system must receive reflected light from a small portion of the lead upon which light is projected. The light may not be optimally reflected from the lead due to an imperfection in the lead surface or due to a slight angularity in the lead itself which does not properly reflect light.

A lead sensing system which could analyze the entire area underneath the printed circuit board from where the inserted leads extend would be preferable. Unfortunately, this area does not offer a consistent and predicable background to the inserted leads. In this regard, the solder patterns on the underside of the boards produce different backgrounds to the leads. The ambient lighting in this area also will change due to extraneous environmental conditions.

OBJECTS OF THE INVENTION

It is an object of the invention to provide a system for reliably checking on the presence or absence of inserted leads from a location remote from the inserted leads.

It is another object of the invention to provide a system for reliably checking on the presence or absence of inserted leads in a variety of situations dictated by the environment surrounding the leads.

It is still another object of the invention to provide a system for reliably checking on the presence or absence of leads when the environmental lighting conditions change.

SUMMARY OF THE INVENTION

The above and other objects are accomplished according to the present invention by providing a lighting system in combination with a remotely located camera that forms an electronic image of inserted leads at a predetermined time in the machine cycle of a component insertion machine. In accordance with the invention, an image analysis system associated with the camera analyzes the electronic image. The entire image analysis is performed in a quick and expeditious fashion so as to not unduly lengthen the machine cycle. The system includes a programmed computer which defines the portions of the electronic image to be analyzed and thereafter notes when one or more leads are missing. The programmed computer furthermore adjusts to various background effects that might otherwise adversely affect the determination of the presence or absence of the leads. This includes an ability to dynamically adjust for different environmental lighting conditions.

BRIEF DESCRIPTION OF THE DRAWINGS

The above and other features of the invention will now be particularly described with reference to the accompanying drawings in which.

DESCRIPTION OF THE PREFERRED EMBODIMENT

Figure 1:
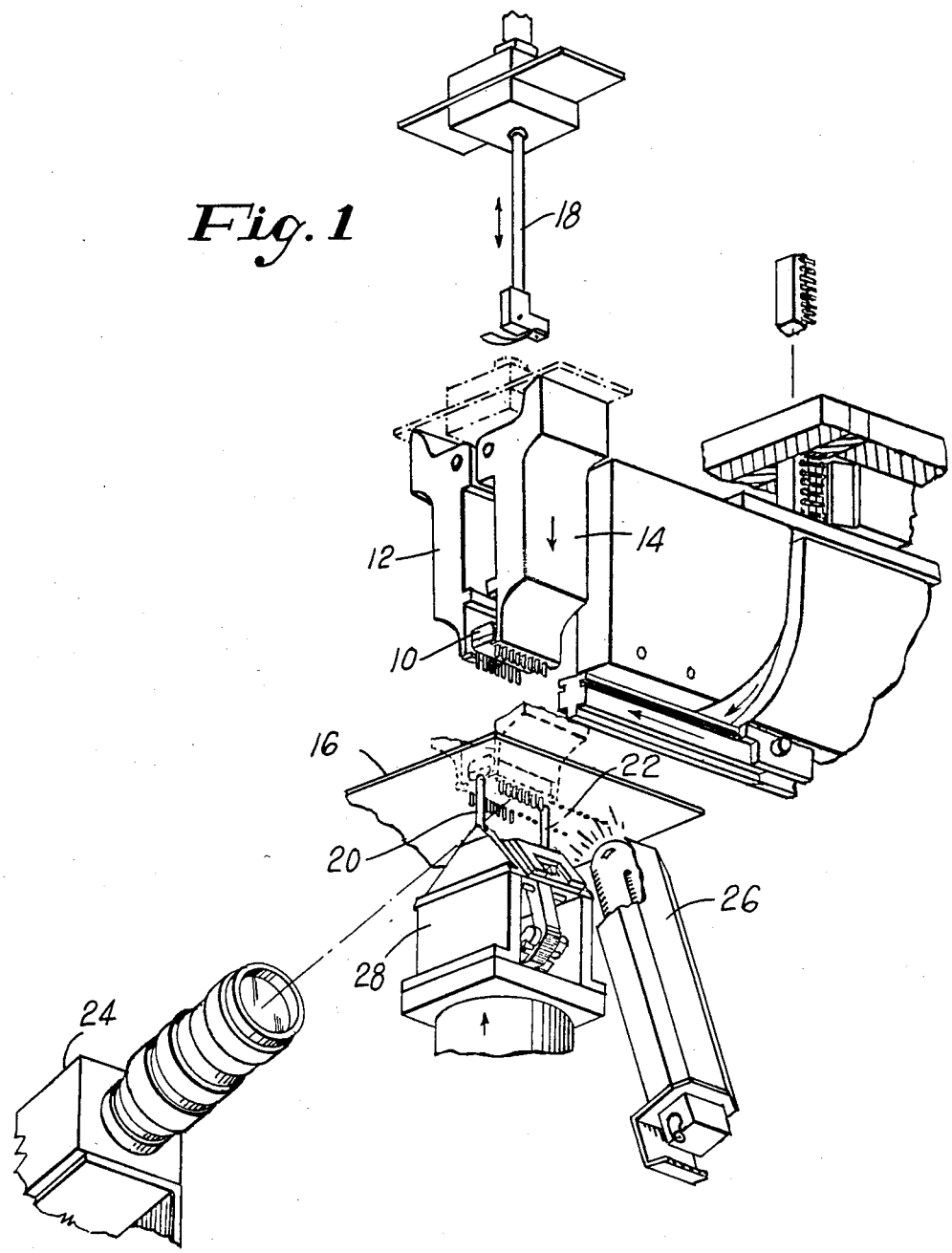
FIG. 1 is a perspective view of a camera oriented toward the underside of a printed circuit board within a component insertion machine.

Referring to FIG. 1, an electrical component 10 having leads extending therefrom is held by a pair of finger grippers 12 and 14 above a printed circuit board 16. It is to be understood that the finger grippers 12 and 14 are part of an insertion head mechanism within a component insertion machine. This mechanism moves downwardly toward the previously positioned printed circuit board 16 in a manner well understood in the art. In this regard, the leads extending from the component 10 will be inserted into appropriate holes within the printed circuit board 16 at the end of the downward stroke. At this time, the grippers 12 and 14 will pivot outwardly and a pusher element 18 will move downwardly into contact with the component 10. The pusher element will exert a downward force on the component that is sufficient to fully insert the leads into the holes of the printed circuit board.

In accordance with the invention, a pair of printed circuit board support columns 20 and 22 will move upwardly into supporting contact with the underside of the printed circuit board 16. The printed circuit board 16 will thus be supported from underneath when the pusher element 18 seats the component 10 in position against the printed circuit board 16. A picture of the thus inserted leads extending from the underside of the printed circuit board 16 is now taken by a solid state camera 24. The camera 24 is physically attached to the frame of the component insertion machine at a location remote from the inserted leads. In particular, the camera is preferably located at an angle of twenty-five degrees with respect to the horizontal. The immediate area underneath the printed circuit board 16 which the camera is thus centered on is illuminated by a light source 26 positioned opposite the camera 24. The light source 26 is preferably a lamp which fully illuminates the downwardly extending leads of the component 10. In accordance with the invention, an analysis is made of the illuminated image of the downwardly extending leads. If all leads are verified as being present, then the board supports 20 and 22 are retracted and a cutting and clinching mechanism 28 is moved upwardly into operative position with respect to the downwardly extending leads.

Figure 2:
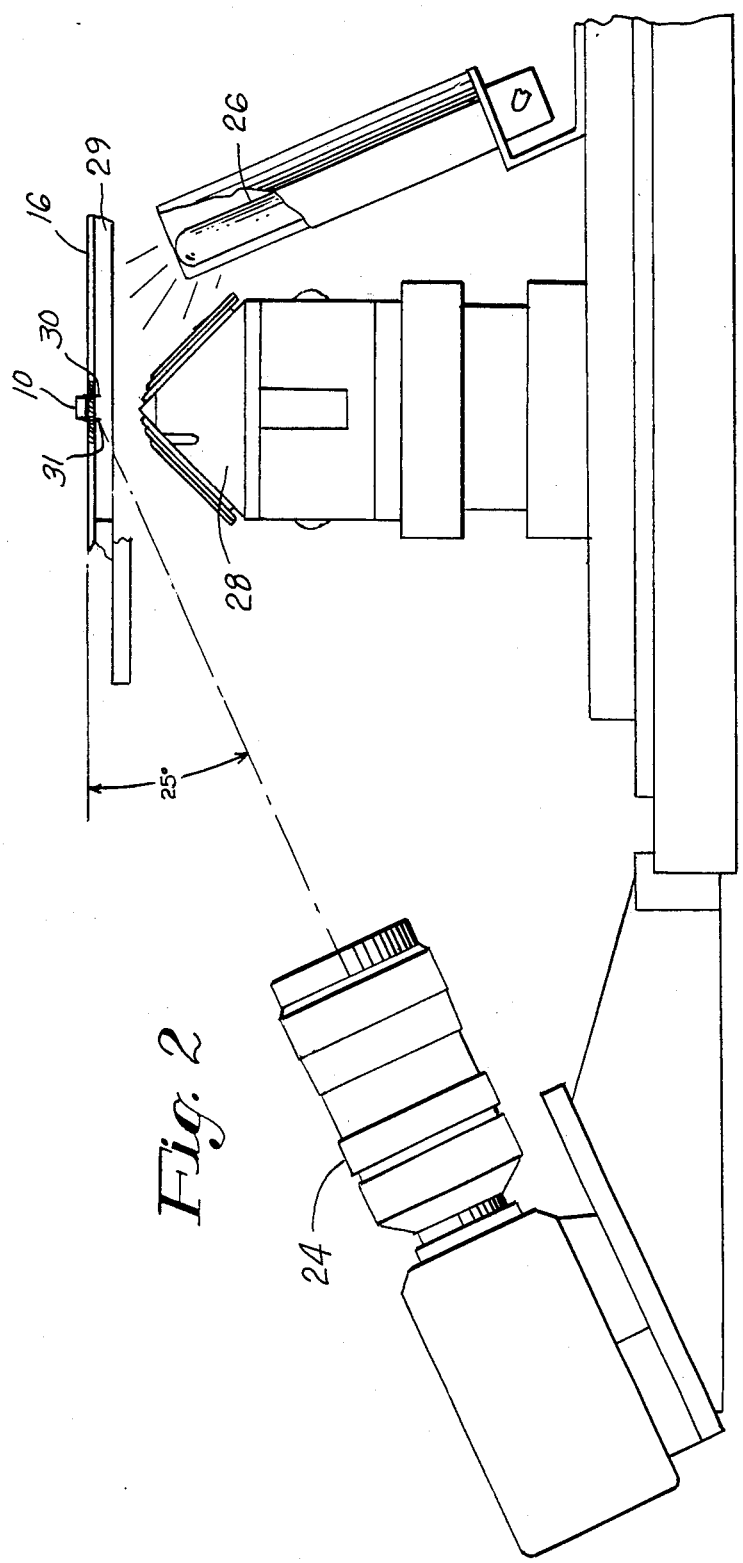
FIG. 2 is a front view of the camera oriented toward the underside of the printed circuit board.

Referring to FIG. 2, a front elevational view of the camera 24 is illustrated relative to the light source 26 and the cut and clinch mechanism 28. The center of the camera lens preferably lies on the twenty-five degree center-line passing the midpoint of the component 10. The twenty-five degree angle of inclination of the center-line allows the entire vertical length of both a back lead 30 and a front lead 31 to be fully viewed in the lens of the camera. It is to be noted that this angle was determined by calculating the angle whose tangent is the maximum length of a protruding lead divided by the distance or spacing between the front lead 31 and the back lead 30. The twenty-five degree angle places the bottom tip of the front lead 31 immediately above the top of the back lead 30 in the image formed by the camera 24. The distance at which the camera is located along the angled center-line from the component is dictated by the constraints of the component insertion machine and where the camera can be suitably mounted. The light source 26 is positioned on the opposite side of the cut and clinch mechanism 28 and immediately below the supporting table 29 for the printed circuit board. The positioning of the light source 26 with respect to the leads of the component allows for the projection of an appropriately illuminated image onto the lens of the camera 24. In this regard, the leads will appear to the camera as dark shadows relative to a white background.

It is important that the lens and electronics of the camera have sufficient resolution so as to adequately define the thus projected image. In this regard, the camera lens must have a focused field of vision of approximately one-half inch vertically by one inch horizontally so as to include all leads of a maximum sized component. The camera electronics must furthermore be capable of forming an electronic image of each lead within this field of vision. The electronics within the camera 24 preferably include discrete light sensitive elements each producing a pixel of information having a resolution of approximately three thousandths of an inch. Such a pixel resolution will optimally produce six pixels of information defining a minimum width of an inserted lead which may be only eighteen thousandths of an inch. It is to be understood however that lighting and other factors may dictate that less than all six pixels of information will actually indicate the width of a lead. In this regard, the edges of a lead may produce gray pixel information as opposed to totally dark pixel information. This may result in for instance only four pixels of information being dark enough to be interpreted accurately as a lead width.

Figure 3:
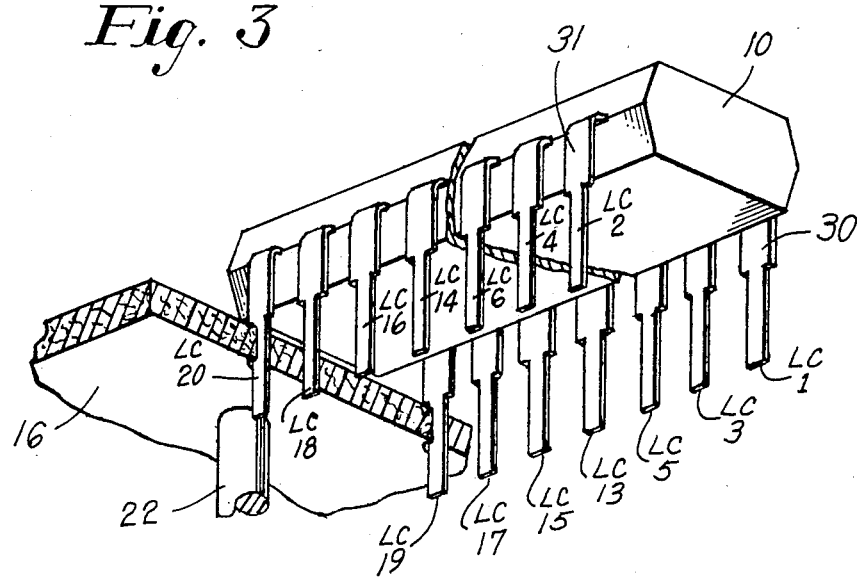
FIG. 3 is a close up view of a component having leads extending down through the printed circuit board.

Referring now to FIG. 3, the largest size of the component 10 is illustrated relative to the printed circuit board 16 and the board support 22. The component is seen to have a maximum of twenty leads with ten leads extending downwardly from each long side of the component. The long side of the component farthest from the camera 24 is seen to have the component lead 30 extending downwardly therefrom whereas the long front side of the component is seen to have the component lead 31 extending downwardly therefrom.

In accordance with the practice used herein for counting leads, lead 30 will be the first lead to be counted whereas lead 31 will be the second. The third lead to be counted will be the lead adjacent to lead 30 along the backside of the component whereas the fourth lead to be counted will be the lead adjacent to lead 31 along the front side of the component. Successive lead counts are indicated in FIG. 3 by the "LC" labels.

Figure 4:
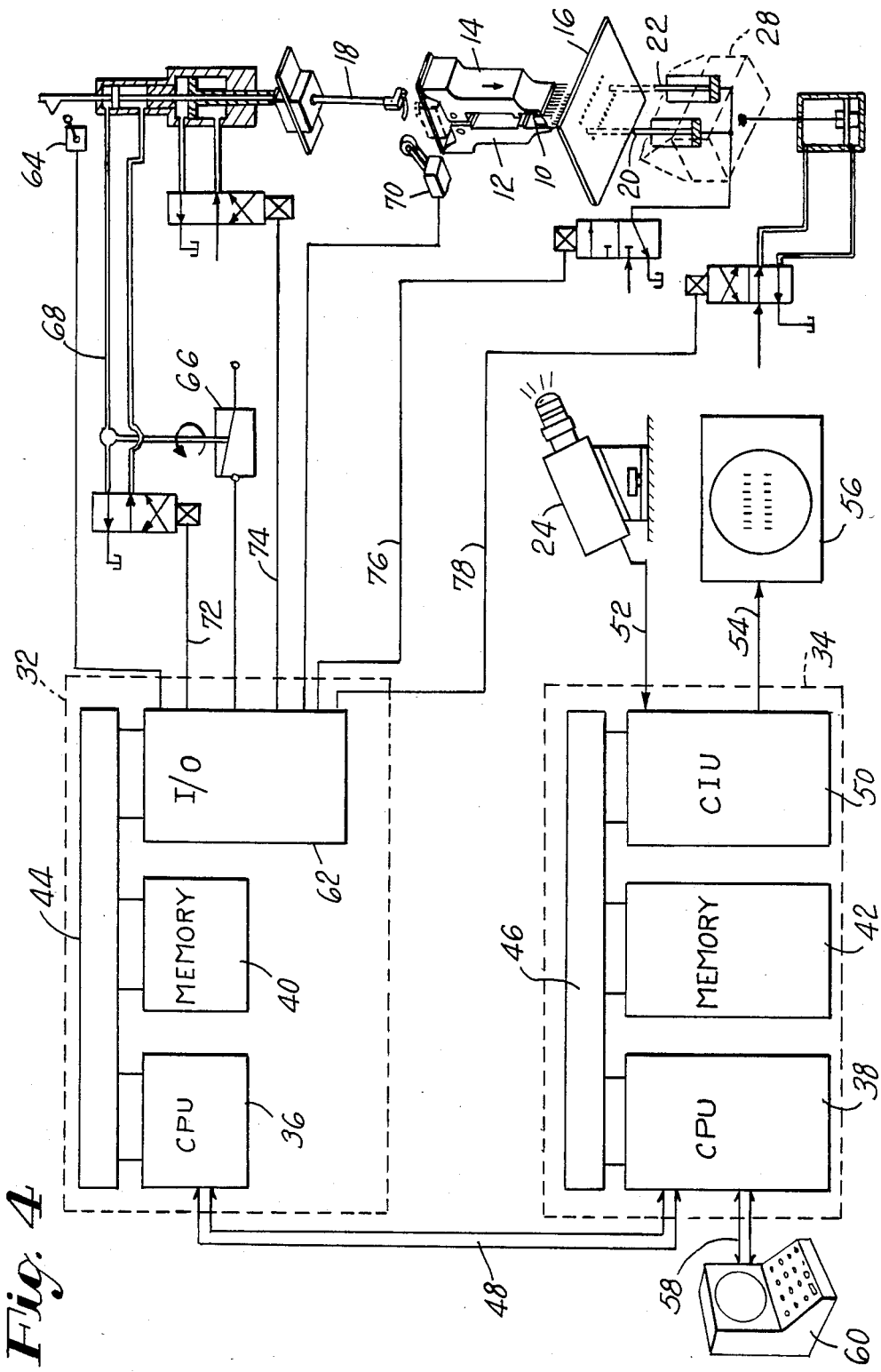
FIG. 4 is a block diagram of a system associated with the camera and various other elements of a component insertion machine.

Referring now to FIG. 4, two separate computer systems are illustrated relative to certain previously described elements of FIG. 1. In particular, a machine control system 32 is illustrated relative to certain elements of the component insertion machine described in FIG. 1, whereas an image analysis system 34 is illustrated relative to the camera 24. Each system comprises a central processor unit, such as CPU 6 for the machine control system, and CPU 38 for the image analysis system. These central processor units are preferably Intel 8080 microprocessors which interface with randomly addressable memories 40 and 42 via Intel multibus circuitry 44 and 46. The central processor units 36 and 38 communicate with each other via a multiple line data-bus 48.

Referring to the image analysis system 34, the central processor unit 38 addresses a camera interface unit (CIU) 50 via the multibus 46. The CIU 50 is preferably a standard interface for a charge coupled device type of solid state camera. Such devices are available from various analog to digital product manufacturers, i.e., for example, Data Cube, Inc. of Peabody, Mass. A particular camera interface unit from Data Cube which may be used is a VG-132. The charge coupled device camera 24 is connected to the camera interface unit 50 via a line 52 which is a standard RS 170 line Following receipt of an authorization from the central processor 38, the camera interface unit 50 will automatically proceed to look for a synchronizing signal from the camera on the line 52. The CIU will thereafter store binary coded information defining an array of pixels numbering 384 horizontally by 242 vertically. In this regard, the camera interface unit will read an analog signal depicting the voltage level of each pixel. The camera interface unit 50 will arbitrarily assign a binary value to the thus read signal based on a predefined threshold value which divides that which is to be regarded as light (binary 0) from that which is to be regarded as dark (binary 1). The resulting pixel bits are stored within an internal memory of the camera interface unit 50 for later use by the central processor unit 38.

Figure 5:
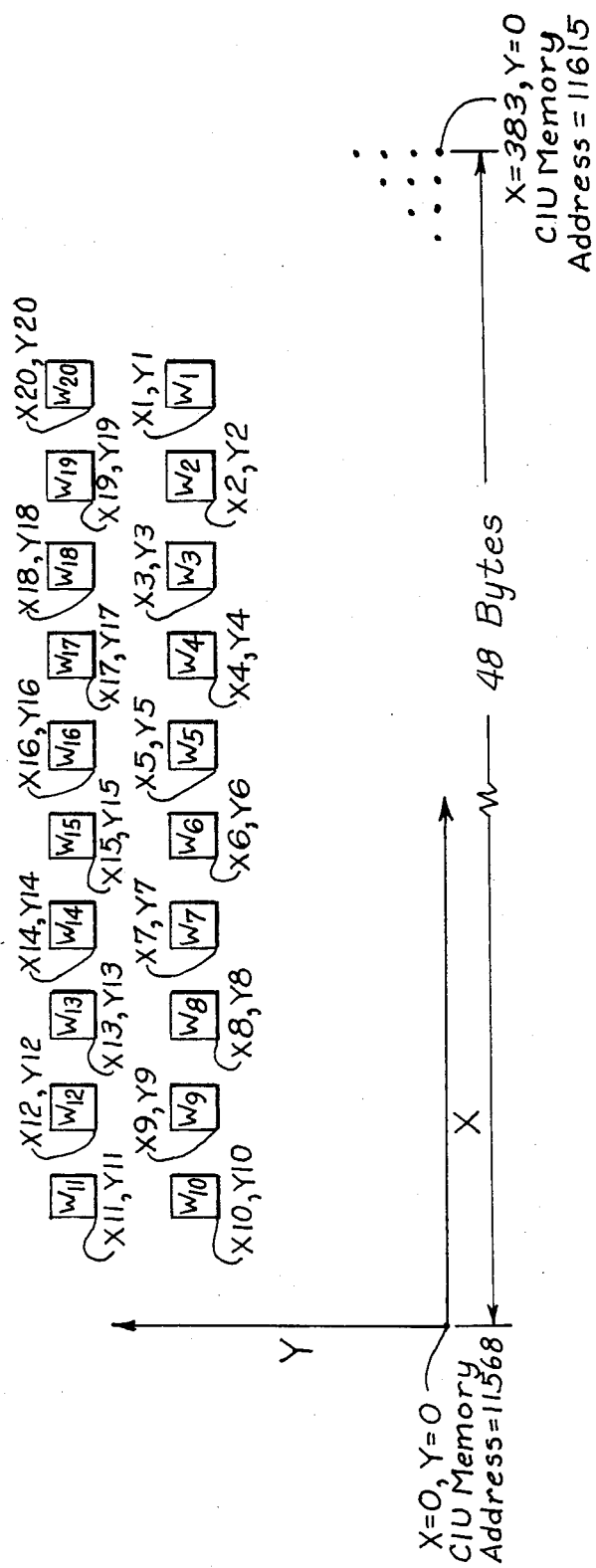
FIG. 5 illustrates the image field of the camera that is to be analyzed by the system of FIG. 4.

Referring now to FIG. 5, an X,Y coordinate system is set forth which defines the location of each pixel within the aforementioned array of 384 by 242 pixels. The Y-coordinate defines 242 successive rows of pixels beginning at Y equals zero and extending to Y equals 241. The pixel locations within each row begin at X equals zero and extend to X equals 383.

The address location within the CIU 50 for each stored pixel bit corresponding to a pixel located at one of the four corners of the array of pixels is also shown in FIG. 5. In this regard, the address locations are indicated for addressable eight bit bytes of information stored within a randomly addressable memory in the CIU 50. The first eight bit byte having a CIU memory address of zero contains, as its most significant bit, the pixel bit corresponding to the pixel located at $X=0$, $Y=241$. Since there are 384 pixel bits in a row, there will be forty-eight bytes of information in a given row. The memory address of 47 will hence define the last addressable byte in the $Y=241$ row and the least significant bit of this addressable byte will correspond to the pixel bit for the pixel occupying the coordinate position of X equals 383 and Y equals 241. In a similar fashion, the addressable byte containing the pixel bit for the pixel located at X equal zero, Y equal zero will have a memory address of 11568 whereas the CIU memory address for X equal to 383, Y equal to zero will be 11615. It is to be noted from the above that an address may be calculated for the first byte of information within a given row of bits defined by the Y-coordinate as follows: memory address=48(241−Y).

A set of windows labeled $W_1$ through $W_{20}$ is illustrated in FIG. 5 relative to the X,Y coordinate system. Each window is seen to have a specific $X_i$, $Y_i$ coordinate defining the left corner of the window. The location of each window as defined by its respective $X_i$, $Y_i$ coordinate should coincide with a lead on the maximum size of component 10 set forth in FIG. 3. In this regard, a portion of each of the leads having lead counts LC1 through LC20 in FIG. 3 should appear within a respective window $W_i$. Referring to FIG. 3, it is to be noted that the index, "I", for the windows $W_i$ does not however correspond to the lead count numbering for the leads. It is therefore necessary to provide the following correlation between the windows, $W_i$ and the lead counts of FIG. 3:

| Window Correlation Table | |
|---|---|
| Lead Count LC | Window Index, I |
| 1 | 1 |
| 2 | 20 |
| 3 | 2 |
| 4 | 19 |
| 5 | 3 |
| 6 | 18 |
| 7 | 4 |
| 8 | 17 |
| 9 | 5 |
| 10 | 16 |
| 11 | 6 |
| 12 | 15 |
| 13 | 7 |
| 14 | 14 |
| 15 | 8 |
| 16 | 13 |
| 17 | 9 |
| 18 | 12 |
| 19 | 10 |
| 20 | 11 |

It is to be appreciated from the above that a window for a given lead is identified by knowing the lead count for that lead and then going to the window correlation table and obtaining the window index number, I.

As has been previously discussed, each window, Wi, will have a left corner coordinate $X_i$, $Y_i$. These coordinates are initially defined in a table of coordinate values as a set of coordinates for each respective window index number. The initial coordinates are such as to space the windows relative to the center of the field of vision of the camera lens so that a camera mounted along the centerline of FIG. 2 should produce an image of leads falling within the windows. In this regard, the leads such as 30 extending from the back side of the component should appear in the windows $W_1$ through $W_{10}$ whereas the leads such as 31 extending along the front side of the component should appear in the windows $W_{11}$ through $W_{20}$. In the preferred embodiment, the initial spacing of the top row of windows from the bottom row is twenty-two pixel locations. This amount is to be added to the $Y_i$ coordinate for the bottom row of windows so as to define the $Y_i$ coordinate for all top row windows. Each corner coordinate $X_i$ for a window is moreover spaced an amount of thirty-one pixel locations in the X-direction from the next adjacent left corner window coordinate. It is hence to be appreciated that all initial $X_i$, $Y_i$ coordinates can be immediately generated when one defines the $X_i$, $Y_i$ coordinate for $X_{10}$, $Y_{10}$ which preferably is $X=16$, $Y=108$.

Each window is preferably fifteen pixel locations in width by fifteen pixel locations in height. A lead appearing within a given window should preferably occupy at least six pixel locations along the window width. The lead length should extend from top to bottom of the window. The leads should appear as dark objects with respect to a white background defined by the back lighting. The stored pixel bits indicating a lead should hence be binary ones. As will be explained in detail hereinafter, all stored pixel bits for a given window can be accessed by addressing appropriate bytes of information and isolating the appropriate pixel bits within the thus addressed bytes.

Referring again to FIG. 4, it is to be noted that the camera interface unit 50 is directly connected via an RS 170 output line 54 to a monitor 56. The monitor 56 merely produces a black and white image representing the stored pixel bits of information in the CIU 50.

Referring now to the image analysis system 34 in FIG. 4, it is seen that the central processor unit 38 communicates via a bus 58 with a terminal 60. The bus 58 is preferably a three wire bus allowing for normal eight bit ASCII coded communications to the central processor unit 38.

Referring now to the machine control system 32, the central processor unit 36 addresses a particular input/output function of an input/output (I/O) circuit 62 via the multibus 44. In this manner, the central processor unit 36 monitors and/or controls certain functions of the component insertion machine. It is to be understood that the machine control system 32 encompasses considerbly more than the specific machine control functions that are depicted in FIG. 5. In this regard, only those machine control functions that interrelate with the image analysis system 34 are particularly illustrated.

The first machine control function to be monitored is that of a switch 64 which trips when the pusher element 18 moves to its downward position against the component 10. A pressure sensitive switch 66 also provides a signal to the I/O circuit 62. In this regard, the pressure sensitive switch 66 monitors the pressure in a pneumatic line 68 associated with the pneumatic drive for the pusher element 18. The input/output circuit 62 is seen to also be connected to a switch 70 which trips when the grippers 12 and 14 move to the downward position so as to position the component 10 with respect to the board 16.

The I/O circuit 62 is also connected to various solenoid controlled valves which control the pneumatic pressures to various machine elements. In this regard, a line 72 provides a control signal to a solenoid controlled valve associated with the pneumatic system for the pusher element 18. A drive line 74 provides a control signal to a solenoid controlled valve associated with the pneumatic system for the component insertion head which houses the grippers 12 and 14. A line 76 provides a command signal to a solenoid controlled valve associated with a pneumatic drive for the supports 20 and 22. Finally, a command is provided over a line 78 to a solenoid controlled valve associated with the pneumatic drive for elevating the cut and clinch mechanism 28.

Figure 6A:
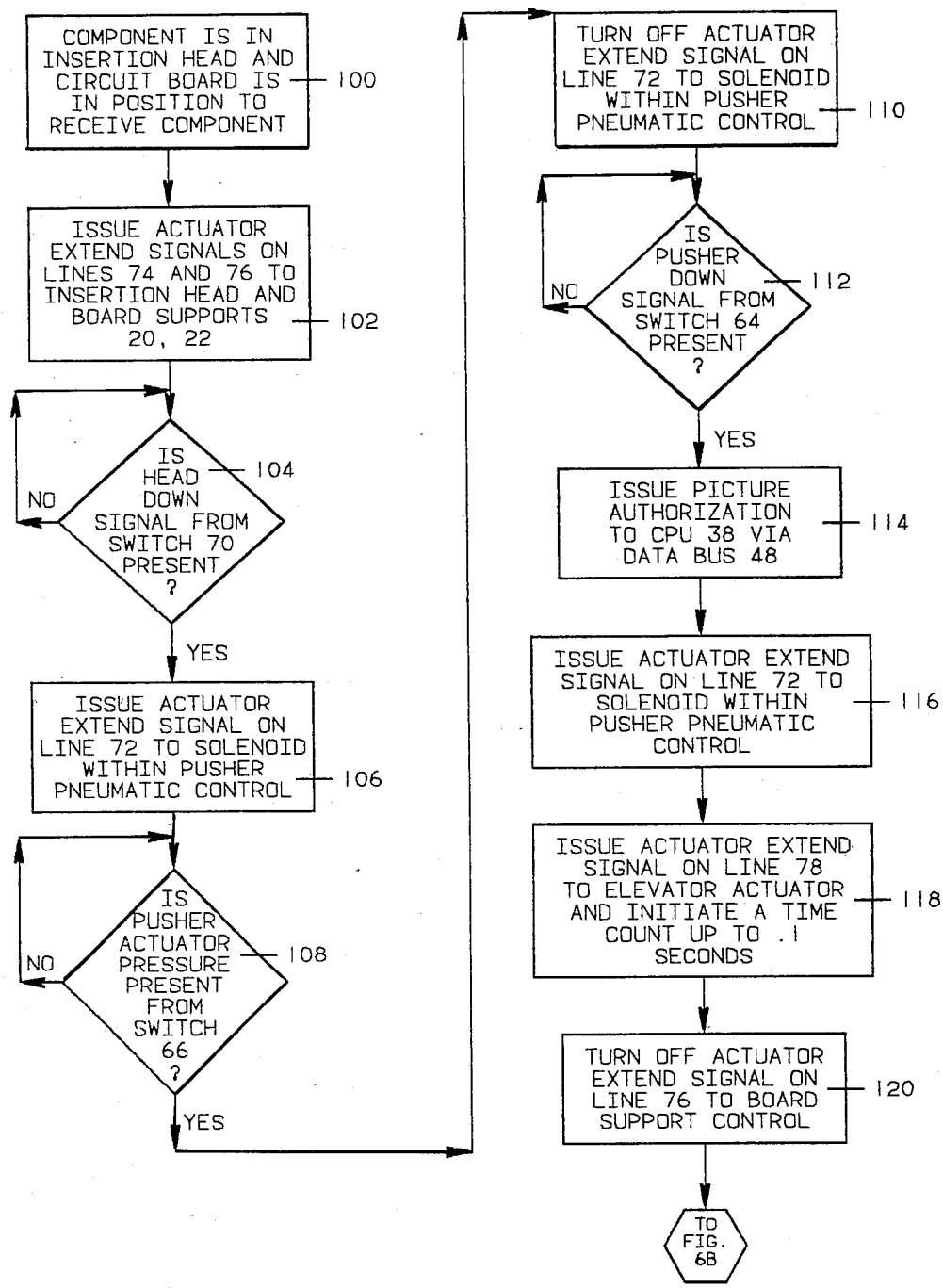
FIGS. 6A and 6B illustrate the operation of a first central processor unit within the system of FIG. 4 which controls certain elements of the component insertion machine.
Figure 6B:
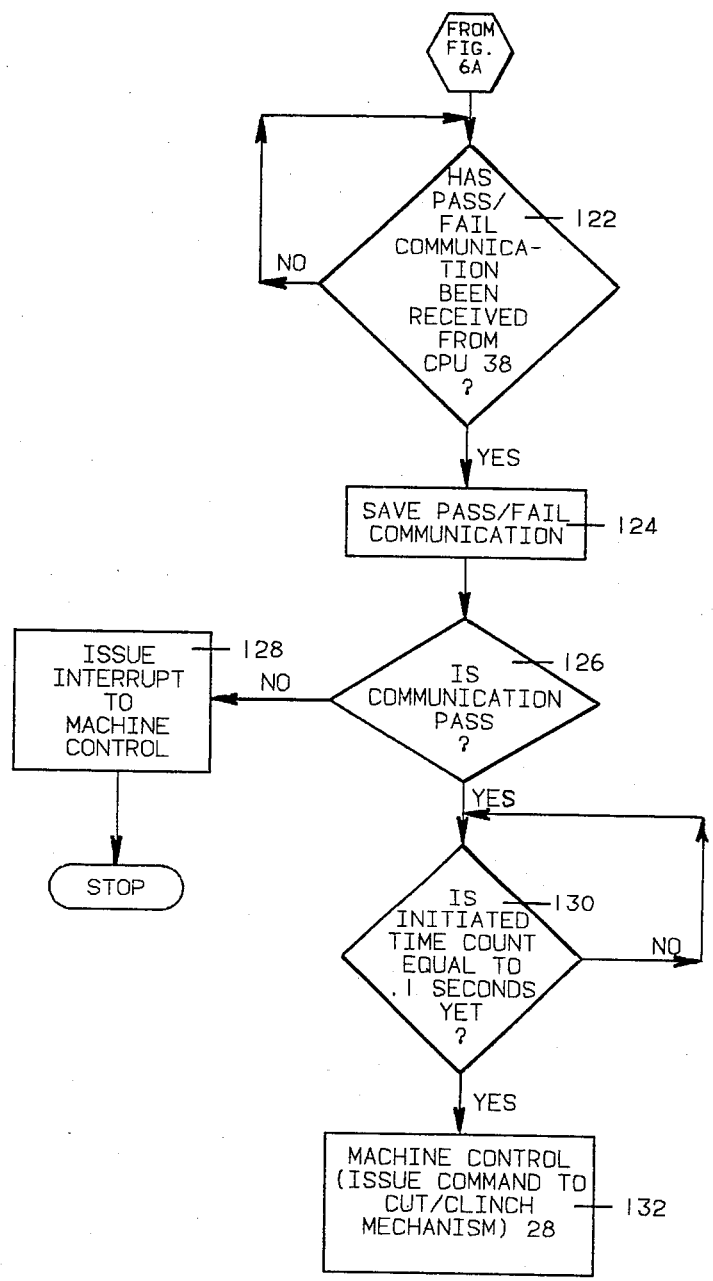

Referring now to FIGS. 6A and 6B, the operation of the central processor unit 36 during the control sequence of the aforementioned machine elements is illustrated. It is to be appreciated that the control sequence depicted in FIGS. 6A and 6B is but a portion of a much larger program wherein the complete control of a component insertion machine is addressed. In this regard, the first step 100 in the flowchart of FIG. 6A requires that a component be in place within the insertion head and that the circuit board 16 be appropriately positioned relative to the insertion head for receipt of the thus held component. At this point in the machine control, the central processor unit 36 proceeds to step 102 and and issues actuator extend signals on lines 74 and 76. This is implemented by addressing the appropriate output lines on the I/O circuit 62 via the multibus 44. The signals thus present on the lines 74 and 76 cause the insertion head to move downwardly towards the printed circuit board 16 whereas the board supports 20 and 22 move up into place underneath the printed circuit board 16. The central processor unit now awaits a signal from the switch 70 indicating that the insertion head is in a downward position as indicated in a step 104. At this time, the central processor unit issues an extend signal on the line 72 to the solenoid controlled valve associated with the pusher pneumatic control. The central processor 36 now awaits in a step 108 for an indication from switch 66 that the pusher actuator pressure is at a predetermined level. This level has been arbitrarily predetermined as the level of pressure necessary to allow the pusher element 18 to exert a downward pressure on the component 10 sufficient to seat the component without deflecting the printed circuit board downwardly. The central processor unit 36 now inquires as to whether the pusher element 18 is in a downward position in a step 112. This indication will be provided to the I/O circuit 60 via the switch 64. It is to be noted that while the pusher element 18 will thus be in a downward position, the amount of pressure thus exerted on the component will not be sufficient to deflect the printed circuit board due to the deactivation of the pneumatic control for the pusher element in step 110. It is to be appreciated that the leads of the component 10 should be extending through the holes underneath the printed circuit board 16 at this time.

The central processor unit 36 now issues a picture authorization signal to the central processor unit 38 via the databus 48 in a step 114. The central processor unit 36 then issues in a step 116 another actuator extend signal on the line 72 to the solenoid controlled valve associated with the pusher pneumatic control. This signal causes the pusher element to again push downwardly with appreciable force on the component 10. While the component is thus being further pushed against the circuit board 16, the central processor unit issues an extend signal on a line 78 to the solenoid controlled valve within the pneumatic control for the elevator actuator for the cut and clinch mechanism 28. This is accomplished in a step 118 wherein the extend signal to the elevator actuator is initiated. A count of one-tenth of a second is also initiated at this time. The central processor in a step 120 now turns off the actuator extend signal on the line 76 to the pneumatic control for the board supports 20 and 22. The central processor unit 38 now awaits a signal from the central processor unit 36 as to whether the component has passed or failed the test for all inserted leads being detected. This is accomplished in a step 122 in FIG. 6B. The pass/fail communication is saved in a step 124 and thereafter analyzed in a step 126. In the event that the communication indicates a failure, the central processor 36 exits to a step 128 and alerts the main machine control to issue a stop. In the event that a pass communication is noted, the central processor 36 proceeds to a step 130 and asks whether the time count set forth in step 118 has expired. When this occurs, the central processor proceeds to a step 132 wherein a normal machine sequence occurs. In this regard, the cut and clinch mechanism 28 is activated and the leads are appropriately cut and clinched. All elements are thereafter returned to their initial position in preparation for handling the next component that is to be inserted.

It is to be appreciated that the operation of the central processor unit 36 disclosed in FIGS. 6A and 6B is specific to a particular Dynapert component insertion machine identified as a DIP Model F or G available from the Dynapert Division of the Emhart Corporation, Beverly, Mass. Other machine control systems having different approaches to the positioning of a component and insertion of leads into a printed circuit board may also be used with the image analysis system 34. In this regard, the image analysis system 34 must merely know when the leads have been fully inserted into the holes of the printed circuit. This can be accomplished by transmitting a signal to the central processor unit 38 at such time as an analysis is to be made of the inserted leads.

Figure 7A:
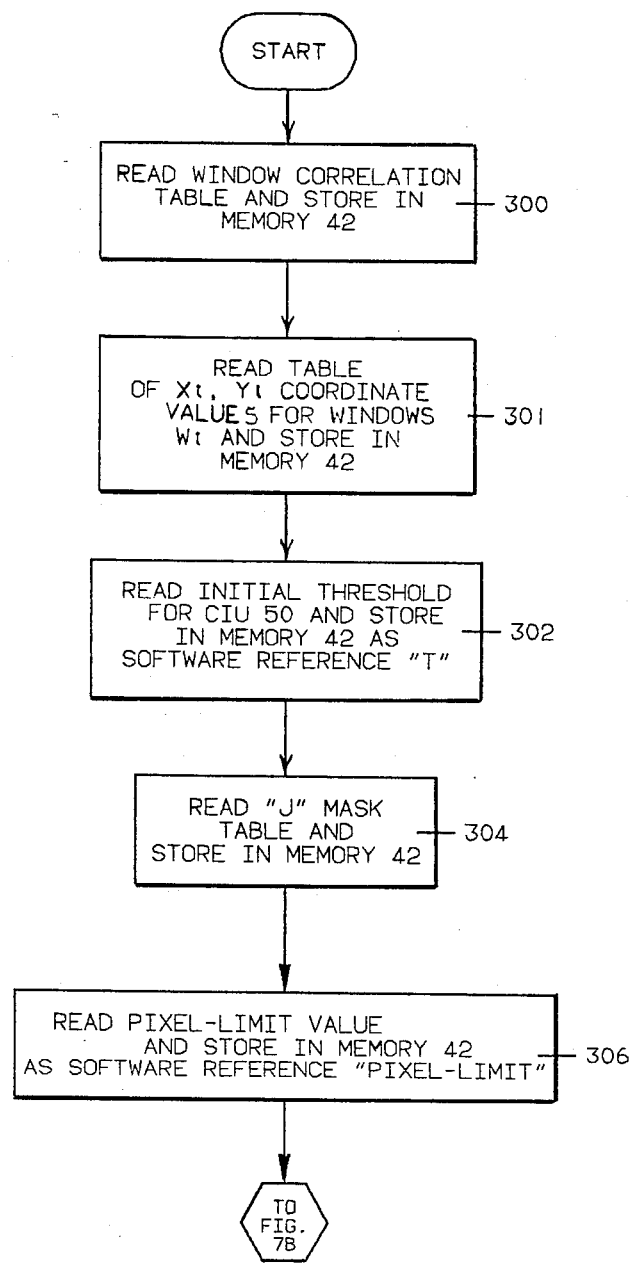
FIGS. 7A and 7B illustrate the overall operation of a second central processor used within the system of FIG. 4 which implements the image analysis.

Referring now to FIG. 7A, a flow chart of the initial steps of the image analysis process is illustrated. The process begins with steps 300 to 306 wherein certain information is initially read into the memory 42. This information can be obtained from any external source to the CPU 38 including the terminal 60. In the preferred embodiment however, this information is obtained from a read only memory associated with the CPU 38. This memory is merely addressed and the information is thereafter transferred via the multibus 46 to the memory 42.

Steps 300 and 301 relate to the accessing and storing of the window correlation table an the table of $X_i$, $Y_i$ coordinates for the windows $W_i$. These tables have been previously discussed with regard to FIG. 6. The window correlation table will be a cross correlation between lead count and window index value. The table of $X_i$, $Y_i$ coordinates will be initial left corner coordinate values for each value of the window index variable "I". Step 302 relates to the reading of an initial threshold value for the CIU 50. It will be remembered that this defines what analog voltage level from the camera 24 is to be used as the crossover point between a light and dark image connotation. In this regard voltages higher than the threshold value will be interpreted by the CIU 50 as light or a binary zero. Voltages less than or equal to the threshold value will be interpreted by the CIU 50 as dark or binary ones.

Step 304 involves the reading into memory of a "J" mask table which has not been heretofore discussed. This table consists of a number of eight bit masks that are to be successively applied to certain bytes of information in a manner that will be described in detail hereinafter. Finally, step 306 is a reading of a pixel-limit value which defines an average number of binary ones that is not to be exceeded on a per-window basis for a given component. The pixel limit is used to adjust the threshold of the CIU 50 in a manner which will be described in detail hereinafter.

In the following step 308 appearing in FIG. 7B, the central processor 38 awaits a picture authorization communication from the CPU 36 via the bus 48. When a picture authorization is received, the central processor 38 pursues the yes path to a step 310 and stores the lead information accompanying the picture authorization in the software variable "lead total". This will be a number that can be used for comparison against the actual number of leads counted upon insertion of the component. The central processor next proceeds to a step 312 and exits to an operating mode program which will be discussed in detail hereinafter. For the moment it is merely to be noted that the operating program will analyze the picture authorized in step 308 for the presence of the leads indicated in step 310.

Referring again to step 308, in the event that a picture authorization is not received, the central processor unit 38 merely awaits a keyboard entry from the terminal 60 in a step 314. In the event that a keyboard entry is made, the central processor unit exits to a diagnostic program in a step 316. The diagnostic program begins with FIG. 8A wherein the ASCII value of the keyboard entry is saved in a step 318 and thereafter compared with the ASCII value for the letter "P" in a step 320. If this comparison results in a yes, the central processor proceeds to a step 322 and authorizes the camera interface unit 50 to initiate storage of a binary coded image from the camera 24. This will result in an array of pixel bits being stored within the camera interface unit 50. The central processor now proceeds to a step 324 and inquires as to whether a further keyboard entry has been received from the terminal 60. When this occurs, the ASCII value of the keyboard entry is stored in a step 326 and a comparison is made in step 328 as to whether or not the stored ASCII value is the equivalent to the letter "D". If the comparison results in a no, the central processor unit merely returns to a point $a$ in FIG. 7B. If the comparison out of step 328 is yes, the central processor unit proceeds to a step 330 and writes a border around each window $W_i$ as those windows have been defined in FIG. 5. In other words, the binary coded pixel bits previously recorded in step 322 that correspond to the outlines of the windows $W_i$ in FIG. 5 are all changed to binary zeros so as to be displayed on the monitor 56 as a white outline. In this manner, windows are drawn on the monitor screen 56 against the black and white image of the stored binary coded image of step 322. The binary coded image of the leads can thus be viewed on the monitor screen 56 relative to the generated windows of step 330. In the event that the displayed windows do not coincide with the displayed leads, then the operator may proceed to rearrange any or all of the windows. This is accomplished by various keyboard entries to the diagnostic program which will now be discussed.

Figure 8A:
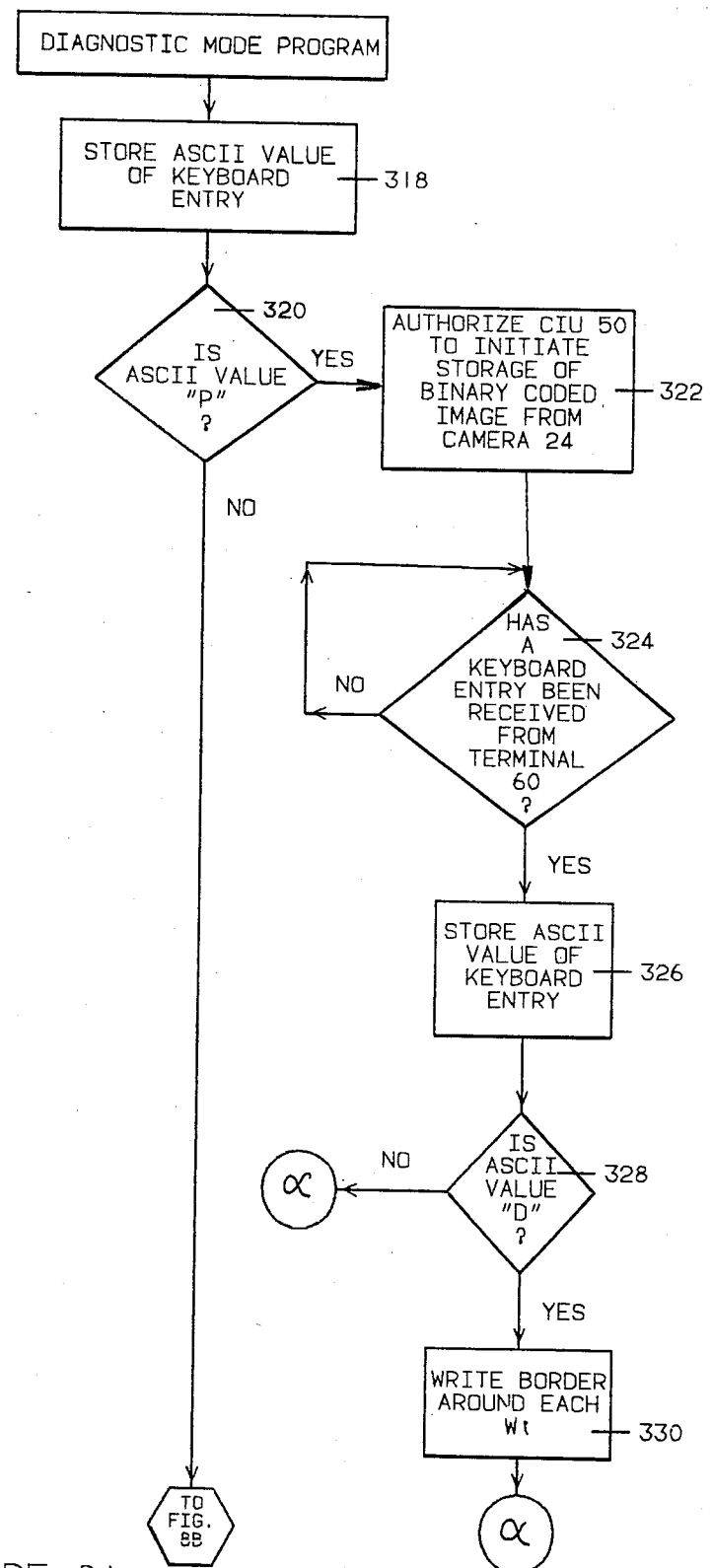
FIGS. 8A-8I illustrate the operation of the second central processor in implementing a certain diagnostic program.
Figure 8B:
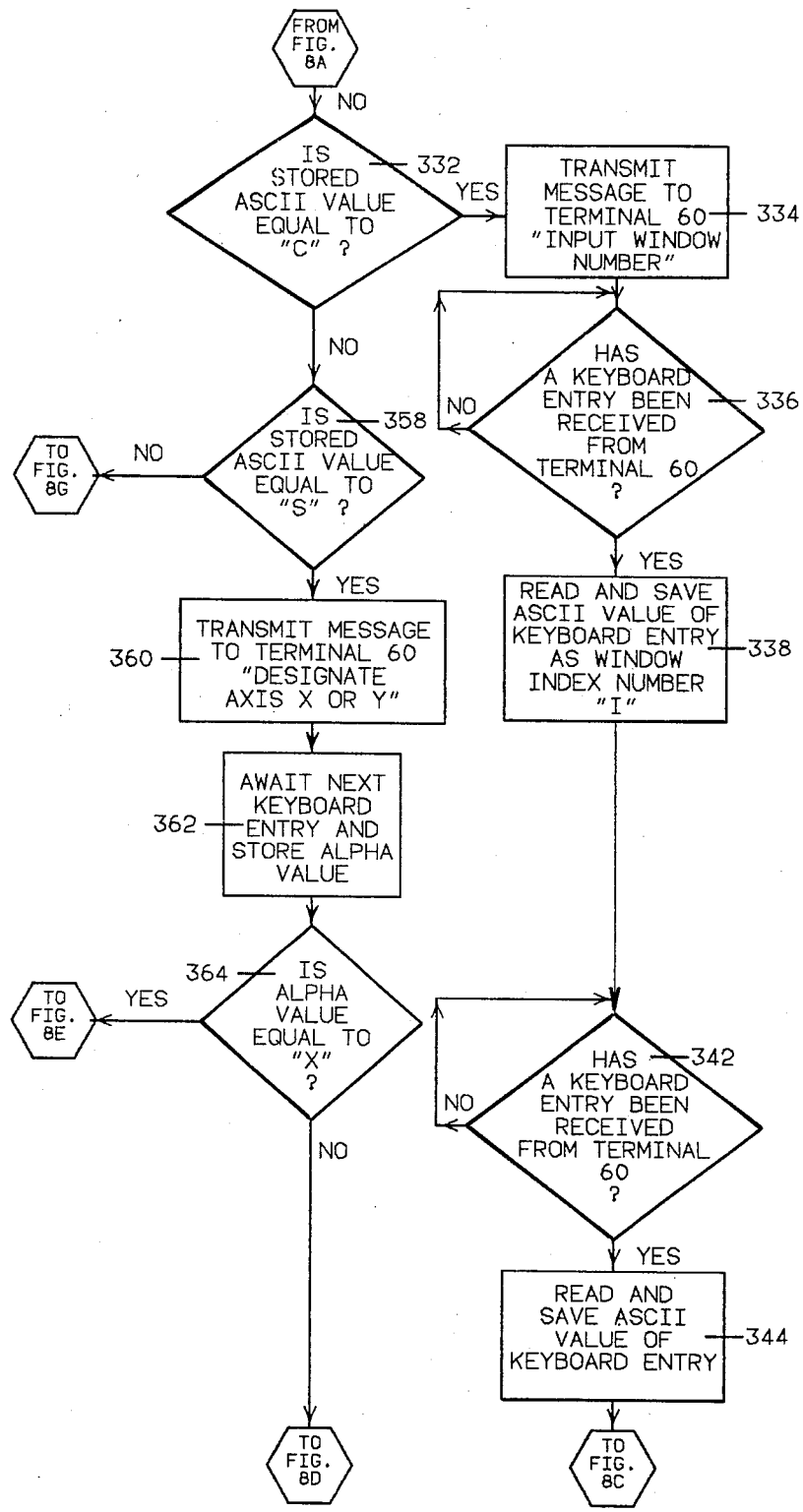
Figure 8C:
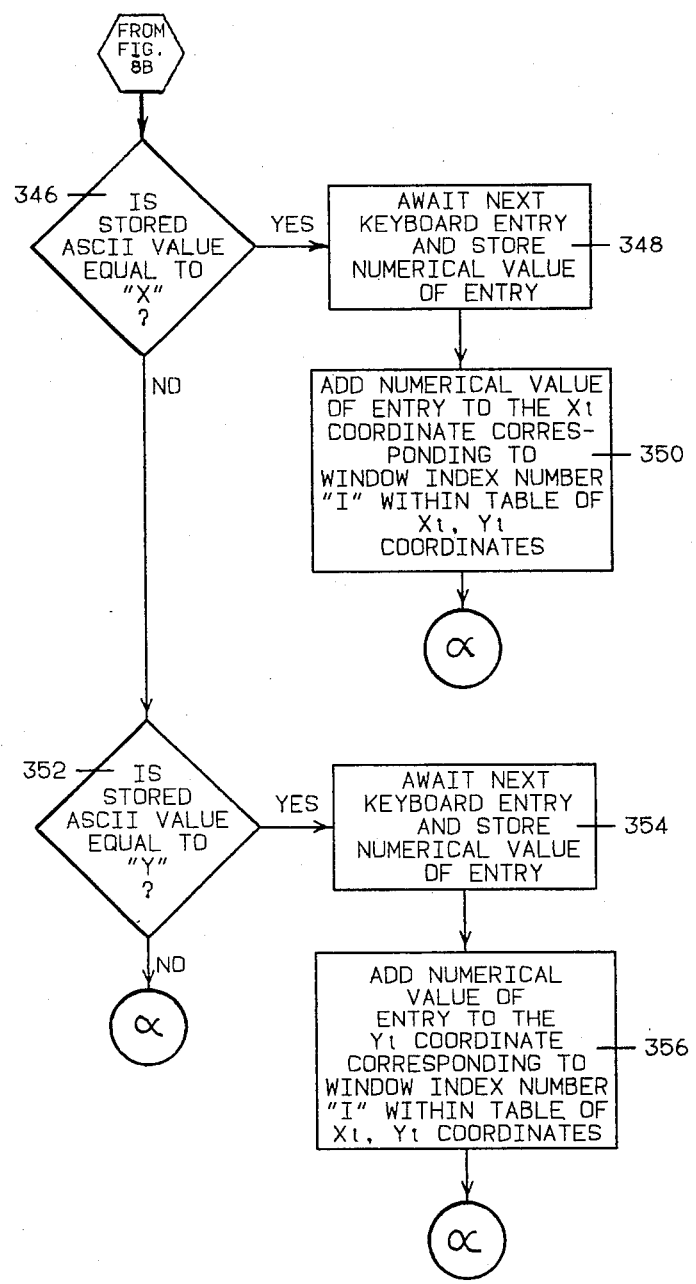
Figure 8D:
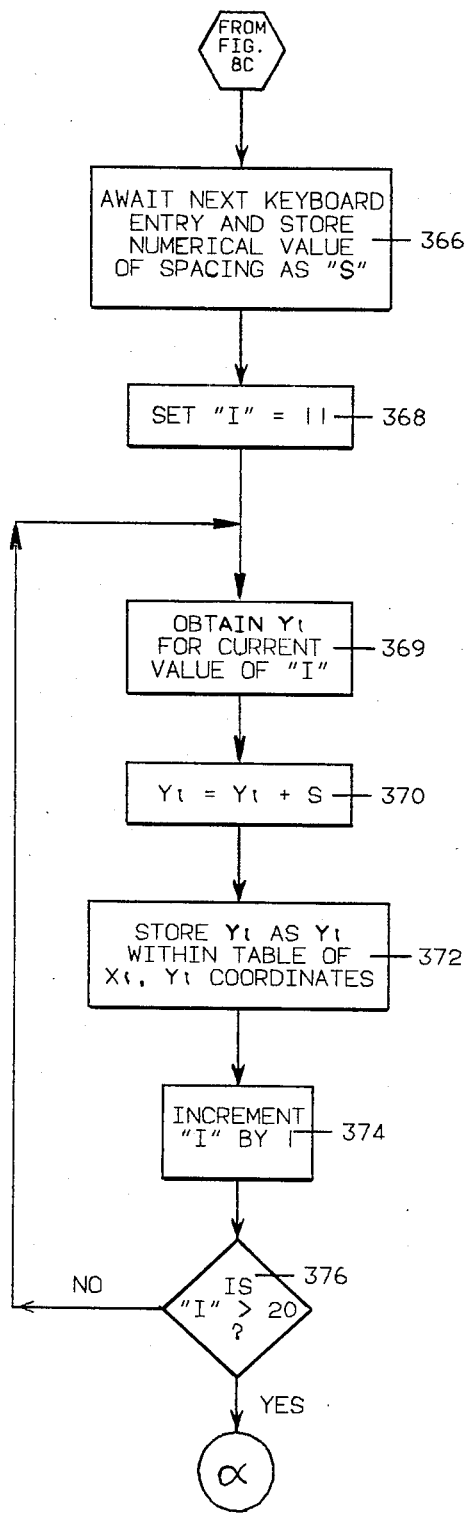

Referring again to step 320, if the keyboard entry stored in step 318 is not equal to the ASCII value for the letter "P", then the central processor pursues the no path to a step 332 in FIG. 8B. Referring to step 332, a question is asked whether the previously stored ASCII value is equal to the letter "C". If this comparison is positive, the central processor unit proceeds to transmit a message to the terminal 60 as defined in step 334. In this regard, the central processor transmits the message "Input Window Number" which is displayed on the monitor screen of the terminal 60. The value entered in response to this message is stored as the window index number, I, in step 338. Steps 342 through 356 thereafter allow for a further keyboard entry to be made wherein the $X_i$ or $Y_i$ coordinate for the thus identified window is changed by an incremental amount. In this manner, any particular window location can be changed by a reiterative looping through steps 332 through 356.

Referring now to step 358, in the event that an "S" key has been depressed on the terminal 60 and stored in step 318, the central processor will proceed to implement shifts of certain windows within the array of windows in FIG. 5 along either the X or Y axis. In this regard, the central processor unit will first inquire in steps 360, 362, and 364 as to whether a shift is to occur along either the X or the Y axis. In the event that an X axis is not identified in step 364, the central processor unit proceeds to a step 366 and awaits the next keyboard entry from the terminal 60. This keyboard entry is stored as the software variable "S". The central processor proceeds in steps 368 through 376 to add the value of "S" to the coordinates $Y_{11}$ through $Y_{20}$. This results in the upper row of windows $W_{11}$ through $W_{20}$ being displaced relative to the lower row of windows $W_1$ through $W_{10}$ in FIG. 5.

Figure 8E:
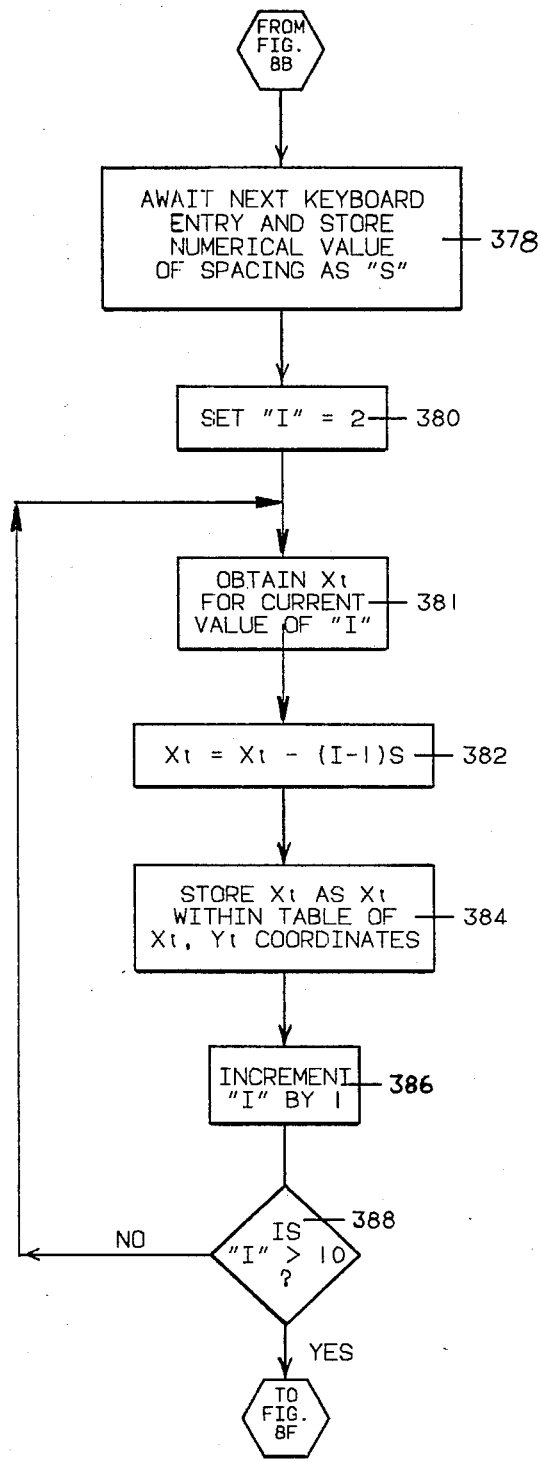
Figure 8F:
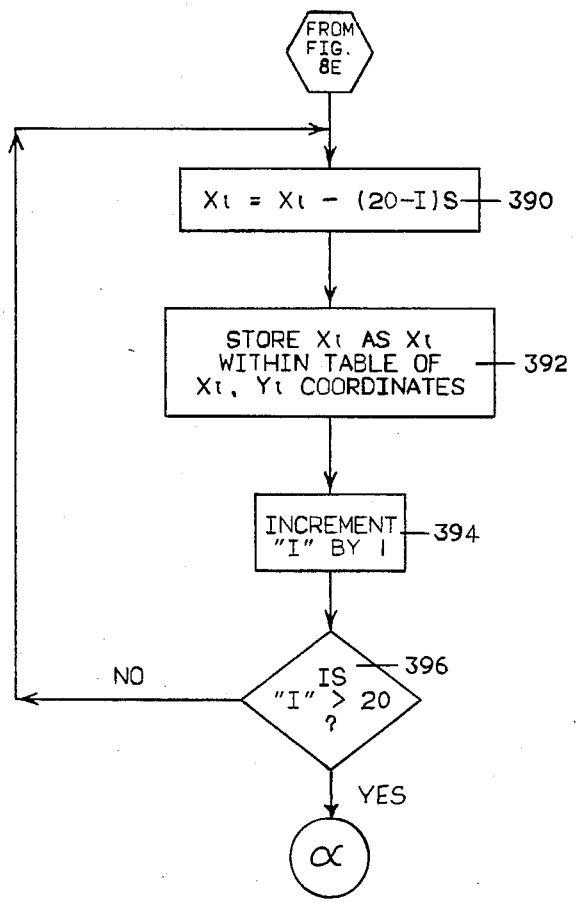

Referring again to step 364 in FIG. 8B, in the event that an "X" key has been depressed, the central processor unit exits to a step 378 in FIG. 8E and proceeds to change the X coordinate value of each of the windows $W_2$ through $W_{10}$ by the indicated amount "S". This is accomplished in steps 380 through 388. The central processor then proceeds to steps 390 through 396 in FIG. 8F and changes the X coordinate values for the windows $W_{12}$ through $W_{20}$ by the indicated amount "S".

Figure 8G:
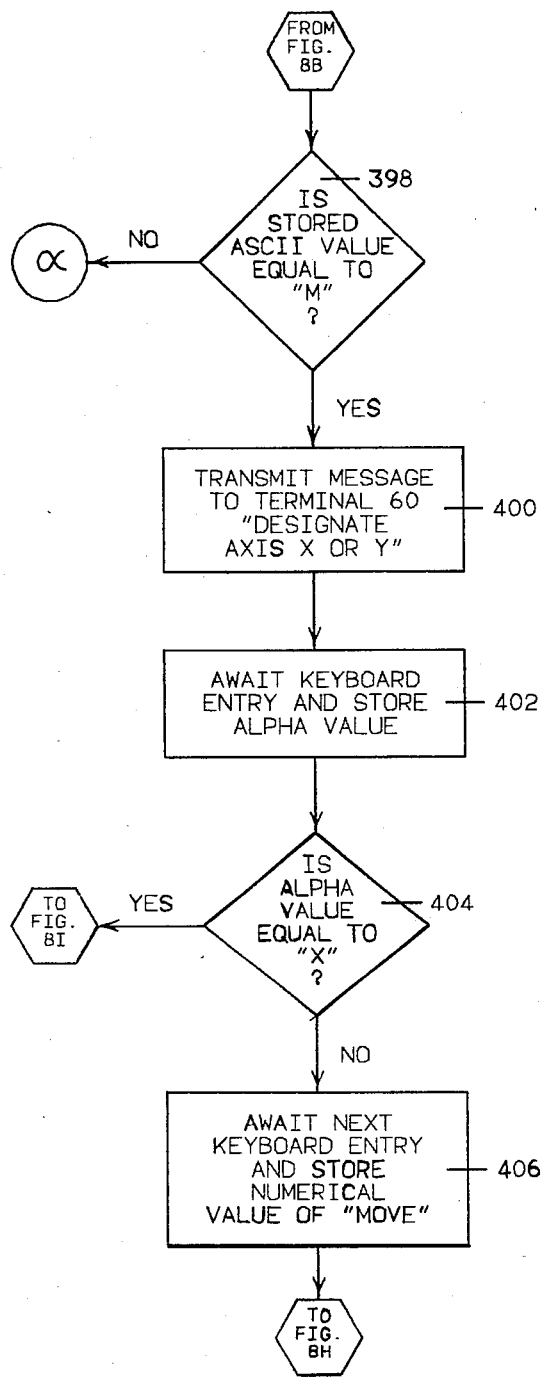
Figure 8H:
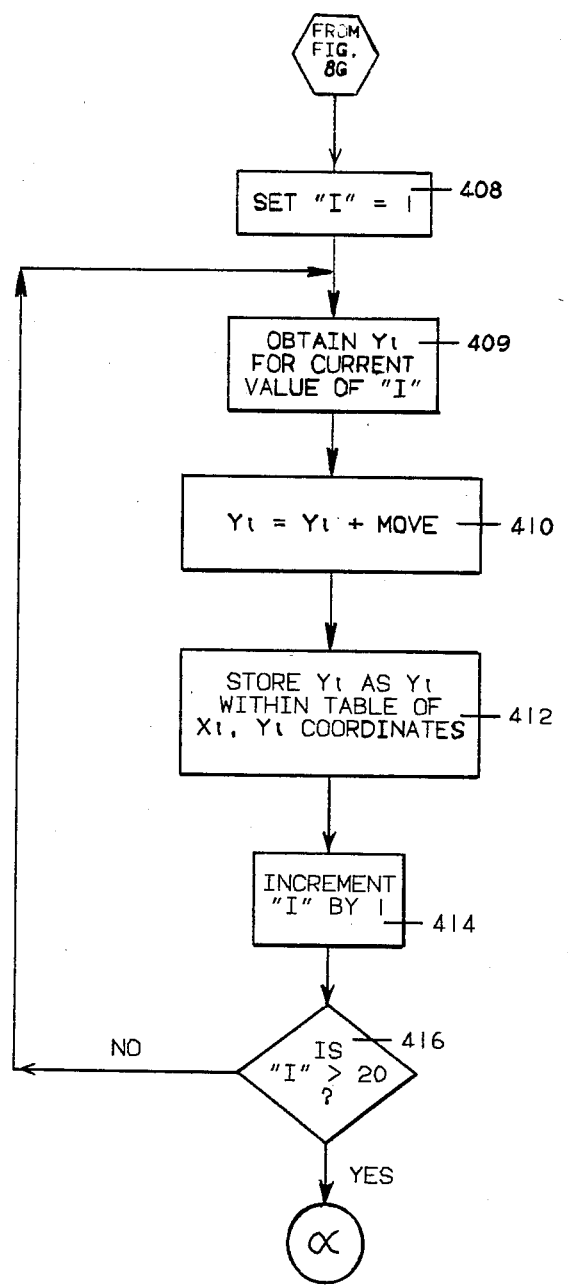

Referring to the step 358 in FIG. 8B, it is to be noted that if the "S" key has not been depressed, the central processor will proceed from the step 358 to a step 398 in FIG. 8G. Referring to FIG. 8G, the central processor is asking whether the keyboard entry stored in step 318 has an ASCII value of "M". This particular keyboard entry will have the effect of alerting the central processor as to a move of the entire window array along either the X or Y axis. In the event that the keyboard entry is not "X", the central processor will proceed to a step 406 and await the next keyboard entry which is stored as the software variable "move". The central processor now proceeds to FIG. 8H wherein a shift of all $Y_i$ coordinates in the amount defined by the software variable "move" is implemented in steps 408 through 416.

Figure 8I:
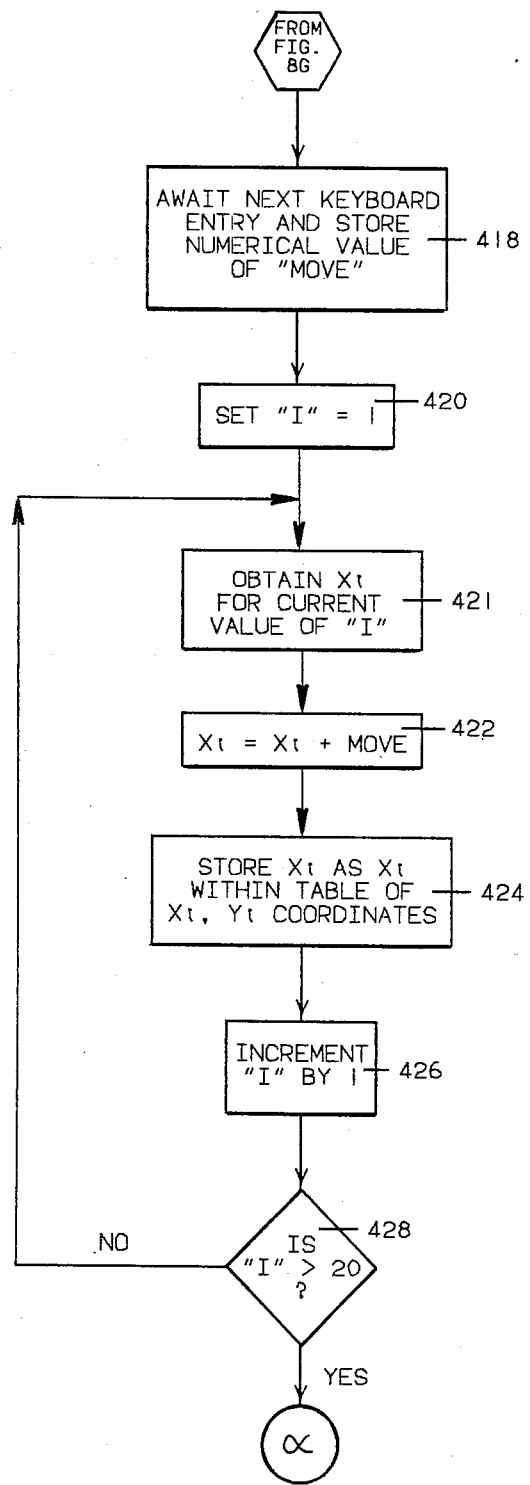

Referring again to step 404 in FIG. 8G, in the event that the keyboard entry of step 402 is an "X", the central processor proceeds out of step 404 to FIG. 8I and awaits the next keyboard entry in a step 418. The central processor now proceeds in steps 420 through 428 to implement a shift of all $X_i$ coordinates by the numerical amount of the software variable "move". It is hence to be appreciated that following the detection of a keyboard entry "M" in step 398, the central processor is operative to implement an incremental move of all windows $W_i$ in FIG. 5 in either the X or Y direction. The incremental move in the X direction is accomplished in steps 418 through 428 whereas the incremental move in the Y direction is accomplished in step 406 through 416.

Figure 7B:
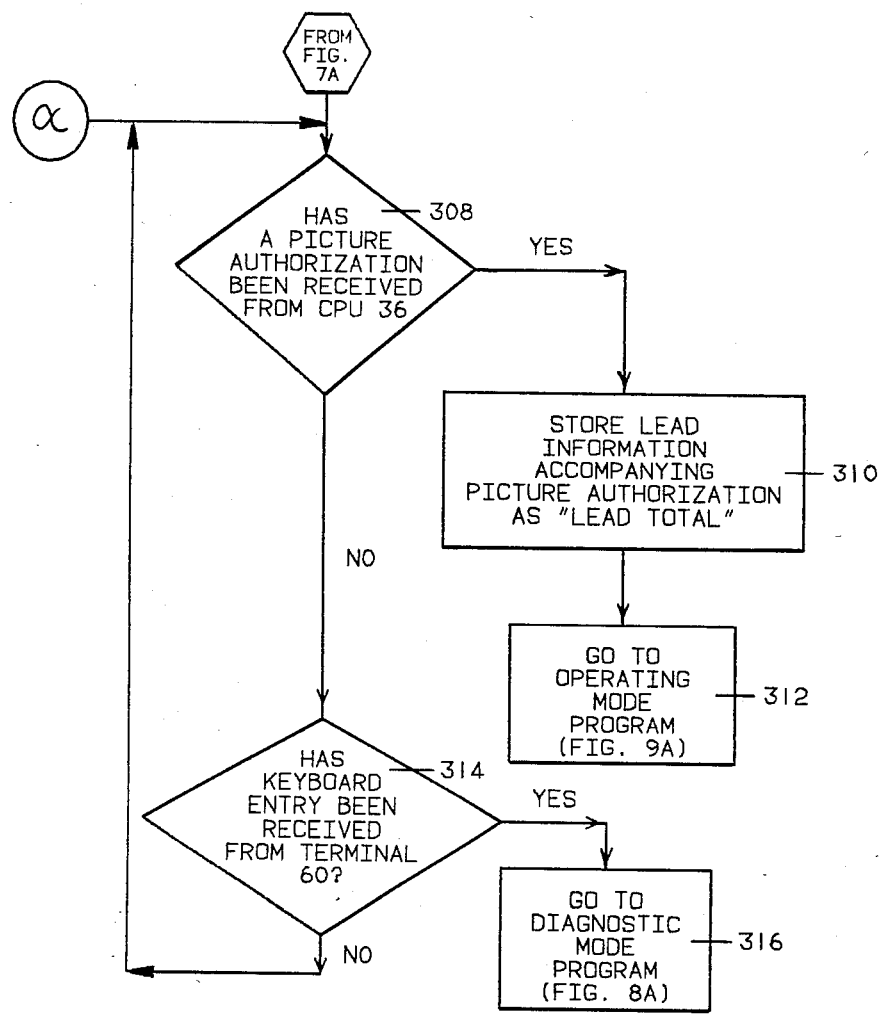

Referring now to FIG. 7B, it is to be noted that all paths of the diagnostic program in FIGS. 8A through 8I return to the $\alpha$ re-entry point in FIG. 7B. This common return point allows the central processor unit to proceed through step 308 to a step 314 as long as a picture authorization has not been received. This allows the central processor 38 to respond to the next keyboard entry which may be a "P". Such an entry allows the central processor to move through steps 322 through 330 wherein the current windows defined by the $X_i, Y_i$ coordinates may be drawn on the screen of the monitor 56. This will, of course, reflect any movement of the windows through changes in the $X_I, Y_I$ coordinates within the diagnostic program. In this regard, to briefly review these changes, a depression of a "C" key will result in a window being moved in either the X or Y direction in accordance with steps 334 through 356. On the other hand, if the keyboard entry in step 314 is decoded as an "S", the central processor will proceed in steps 358 through 376 to either move the top row of windows in the Y direction by an incremental spacing or to move windows $W_2-W_{10}$ and $W_{12}-W_{20}$ in the X direction by an incremental spacing. The movement of the top row of windows in the Y direction is accomplished in steps 366 through 376 whereas the incremental movement in the X direction is accomplished in steps 378 through 396. Again referring to step 314, if an "M" key is depressed, then the central processor will proceed to steps 398 through 428 and implement a move of all windows in either the X or Y direction by a prescribed amount.

Figure 9A:
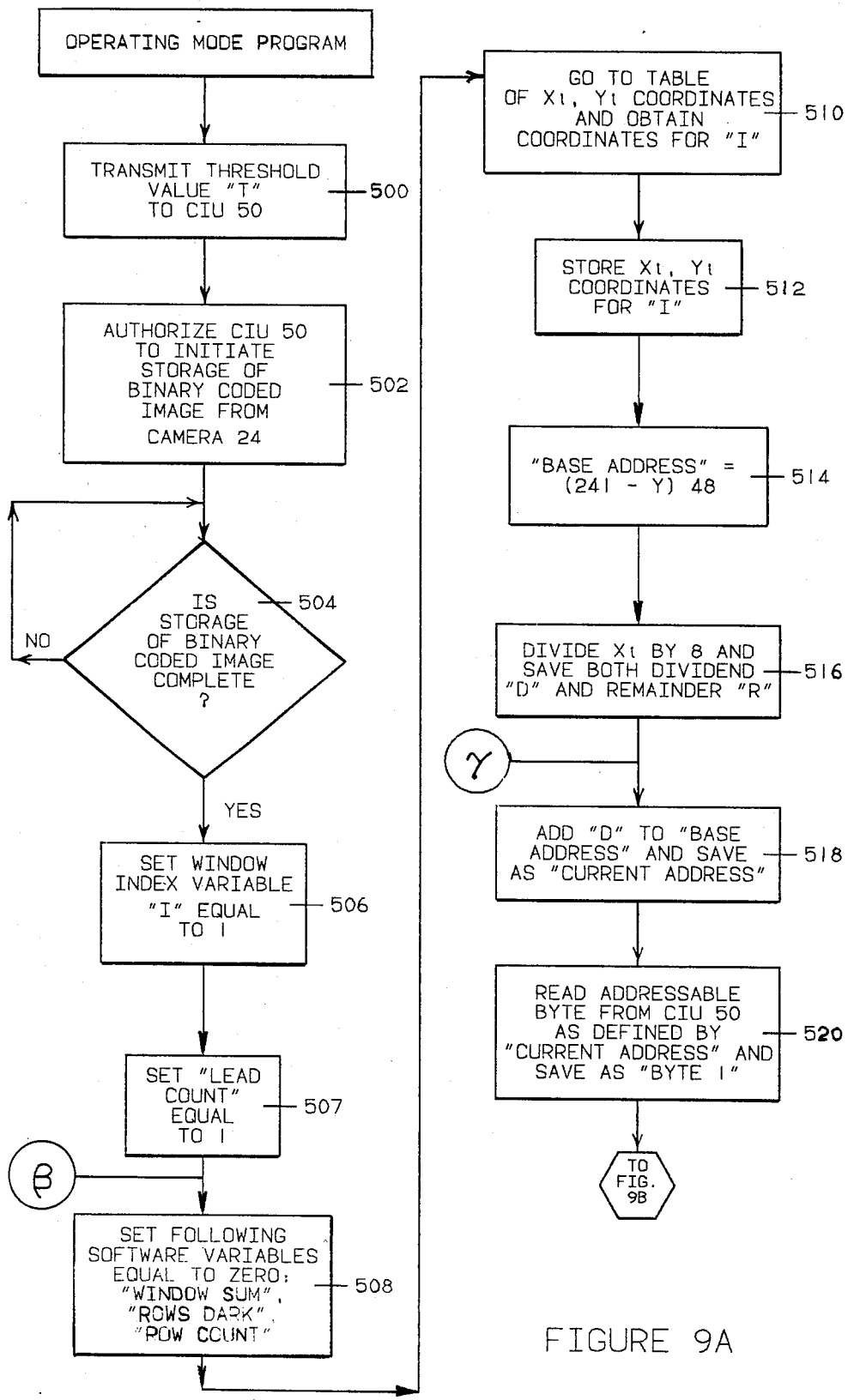
FIGS. 9A-9H illustrate the operation of the second central processor in implementing an operating mode program.
Figure 9B:
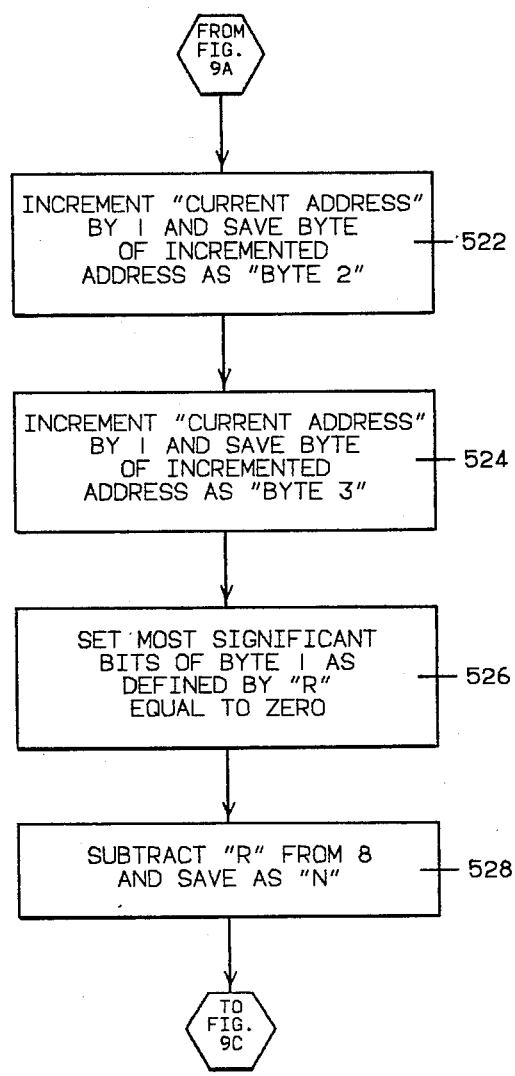
Figure 9C:
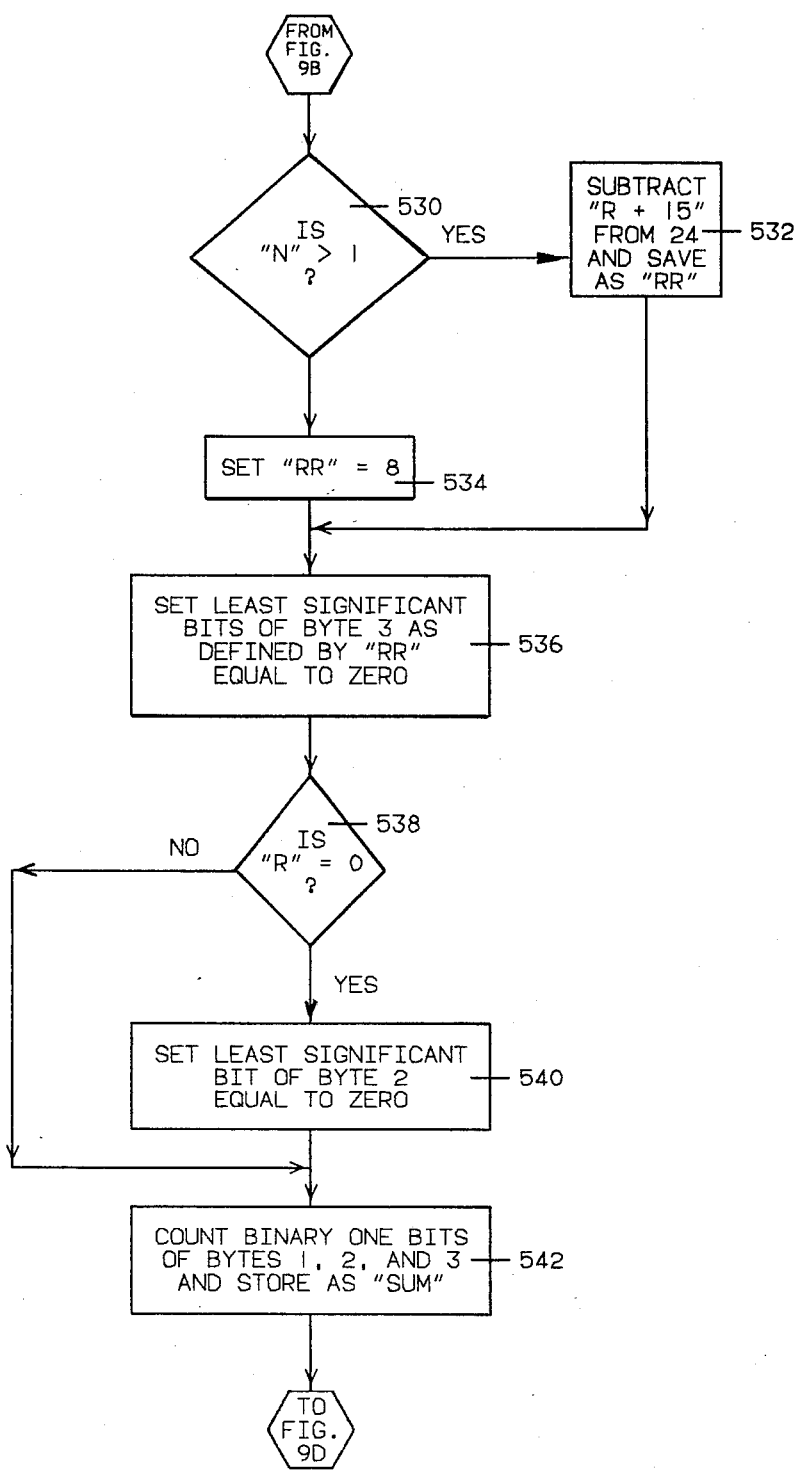

Referring, again to FIG. 7B, it will be remembered that the central processor 36 exits to an operating mode program in step 312 when a picture authorization has been received in step 308. The operating mode program is illustrated beginning with FIG. 9A. Referring to FIG. 9A, the operating mode program begins with a step 500 wherein the threshold value (initially stored in the software reference "T" in step 304) is transmitted to the CIU 50. It will be remembered that this threshold value is used by the CIU to determine whether a particular pixel voltage from the camera 24 is to be interpreted as a dark or light signal. Each so characterized pixel voltage is stored as either a binary one (dark) or binary zero (light) in step 502. The central processor unit 36 proceeds to a step 504 and awaits the completion of this storage. This will be indicated to the central processor by a status signal from the CIU 50. At this point in time, there will be a complete storage of the entire array of 384 by 242 pixel bits in a randomly addressable memory within the CIU 50. These pixel bits will be stored in the CIU memory as addressable bytes in accordance with the addressing scheme previously discussed relative to FIG. 5. Following storage of the binary coded image in pixel bit form, the central processor proceeds to a step 506 and sets the window index variable, "I", equal to one. The central processor then proceeds to a step 507 and sets the "lead count" variable equal to one. The central processor now proceeds to a step 508 and sets still other software variables equal to zero. It is to be noted that these particular variables will always be set equal to zero each time the central processor returns to the step 508 via a return point $\beta$. The central processor proceeds from step 508 to a step 510 and obtains the $X_i$ and $Y_i$ coordinates for the current value of the window index variable "I". Since this variable is initially set equal to 1 in step 506, the first pass through step 510 will result in the coordinates $X_1$ and $Y_1$ being obtained. These coordinates will be stored in step 512. The central processor now proceeds to a step 514 and calculates a "base address" using the coordinate value of $Y_i$. It will be remembered that this address defines the first addressable byte in any given Y-row in FIG. 5. The central processor now proceeds to a step 516 and divides the $X_i$ coordinate value by eight and saves both the dividend "D" and the remainder "R" of this division operation. The Dividend "D" is thereafter added to the "base address" and saved as a "current address" in a step 518. The central processor now proceeds to a step 520 and reads the addressable byte of information from the CIU 50 as defined by the current address. This byte of information is saved as a "byte 1". The central processor now proceeds to a step 522 in FIG. 9B and increments the value of the current address by one. The addressable byte in the CIU defined by the thus incremented address is stored as a "byte 2". The central processor now proceeds to step 524 and again increments the current address by one and saves the byte of the thus incremented address as a "byte 3". It is to be appreciated that the steps 518 through 524 have located three bytes of information in the CIU memory which contain the pixel bits for the bottom-most row of pixels in the first window $W_1$. It will be remembered that these window pixel bits will be fifteen in number. It therefore remains to isolate the particular fifteen pixel bits from the bytes identified a byte 1, byte 2, and byte 3. The extraction of meaningful pixel bits from these three bytes begins with a step 526 wherein the most significant bits of the byte 1 defined by the remainder "R" of step 516 are set equal to zero. This effectively disregards any bits in byte 1 that are not a pixel bit within the window. The central processor now proceeds to a step 528 and subtracts the remainder "R" from eight and saves the difference as the software variable "N". The central processor now proceeds to a step 530 in FIG. 9C and asks whether the value of "N" is greater than one. In the event that "N" is greater than one, the central processor proceeds to a step 532 and subtracts "R+15" from twenty four and saves the difference "RR". On the other hand, if the value of "N" is not greater than one, the central processor proceeds to a step 534 and sets the software reference "RR" equal to eight. The central processor now proceeds to step 536 and sets the least significant bits of the byte 3 as defined by the software reference "RR" equal to zero. This effectively disregards any bits in byte 3 which are not pixel bits of the window currently being defined by the value of "I".

The central processor now proceeds to step 538 wherein the remainder "R" is examined for possibly being equal to zero. If the remainder is equal to zero, the central processor proceeds to a step 540 and sets the least significant bit of byte 2 equal to zero. It is to be noted that step 540 is a special case situation with regard to byte 2. In other words, if the remainder "R" is anything other than zero, then all eight bits of byte 2 will be part of the window currently under examination. In other words, since each window is fifteen pixel bits in width, anything other than all eight bits of byte 1 would necessarily require a full eight bits from byte 2. In this later case, the central processor exits from step 538 via the no path and completely avoids step 540.

Figure 10A:
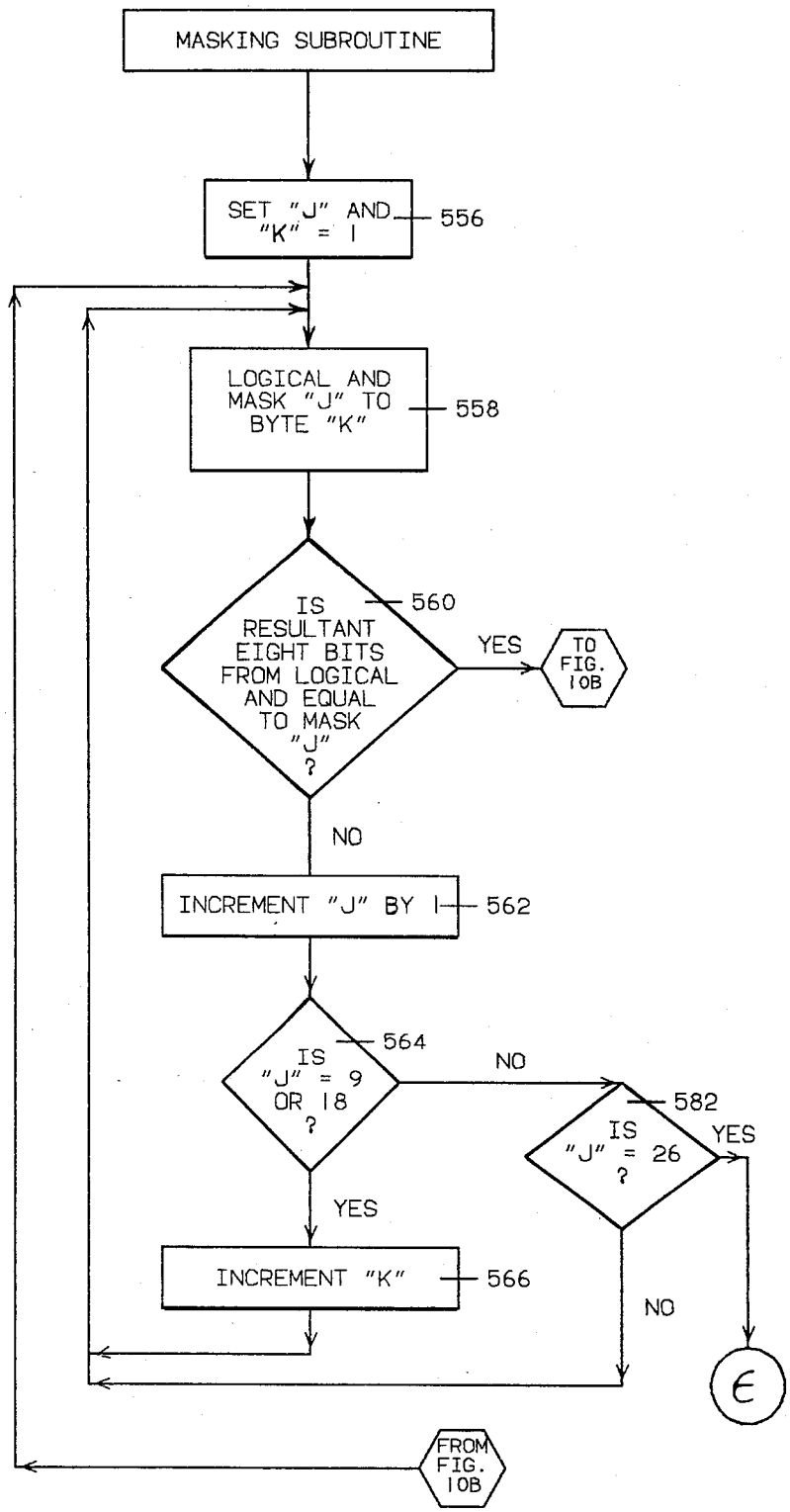
FIGS. 10A-10B illustrate a subroutine implemented in conjunction with the operating mode program of FIGS. 9A-9H.

It is to be appreciated that following step 538 or step 540, the central processor has effectively isolated the fifteen window bits in bytes 1, 2, and 3. It remains to be determined whether any of these bits indicate a possible lead being present within the window under examination. In accordance with the invention, any two successive binary one bits within the fifteen isolated window bits will be interpreted as possibly indicating the presence of a lead. An analysis of these bits toward that end begins with a step 542 wherein the "sum" of all binary ones within these bits is generated. In this regard, it is to be noted that all other bits of bytes 1, 2, and 3 have been set equal to zero in steps 526, 536, and 540. The "sum" thus generated will merely be the sum of any binary ones in the fifteen window bits. The central processor now proceeds to a step 544 and adds the "sum" to a cumulative value stored within the software variable "window sum". The central processor now proceeds to analyze the significance of the particular value of "sum" in steps 546 and 548. In this regard, the central processor checks to see whether the value of "sum" is greater than seven in step 546 or less than two in a step 548. It is to be appreciated that any value of "sum" greater than seven means that there are at least two successive binary one bits among the fifteen window bits. On the other hand if the value of "sum" is less than two, then there is no possibility of anything other than a single binary one bit being present among the fifteen window bits. In the event that the value of "sum" is greater than seven, the central processor proceeds from step 546 to a step 550 and adds one to the cumulative value of "rows dark". On the other hand, if the value of the "sum" is less than two, then the central processor proceeds to a step 552 and sets the value of "rows dark" equal to zero. In the event that the value of "sum" lies between two and seven, the central processor proceeds to a masking subroutine in a step 554. In this latter instance, it remains to be determined whether two successive binary one bits are present in the fifteen isolated window bits. Referring now to FIG. 10A the masking subroutine begins with a step 556 in FIG. 10A wherein two variables, "J" and "K" are initially set equal to one. These variables define reiterative loops through the steps which follow beginning with a step 558. Referring to step 558, the bits of a mask "J" are to be logically ANDed to the bits of a byte "K". The byte "K" will first be the byte 1. The numerical value of "J" defines one of nine possible eight bit masks within the "J" mask table which was initially read into the memory 42 in step 304. The "J" mask table will appear as follows within the memory 42:

| "J" No. | MASK TABLE Mask Configuration | | | | | | | |
|---|---|---|---|---|---|---|---|---|
| 1, 10, 19 | 1 | 1 | 0 | 0 | 0 | 0 | 0 | 0 |
| 2, 11, 20 | 0 | 1 | 1 | 0 | 0 | 0 | 0 | 0 |
| 3, 12, 21 | 0 | 0 | 1 | 1 | 0 | 0 | 0 | 0 |
| 4, 13, 22 | 0 | 0 | 0 | 1 | 1 | 0 | 0 | 0 |
| 5, 14, 23 | 0 | 0 | 0 | 0 | 1 | 1 | 0 | 0 |
| 6, 15, 24 | 0 | 0 | 0 | 0 | 0 | 1 | 1 | 0 |
| 7, 16, 25 | 0 | 0 | 0 | 0 | 0 | 0 | 1 | 1 |
| 8, 17, 26 | 0 | 0 | 0 | 0 | 0 | 0 | 0 | 1 |
| 9, 18, 27 | 1 | 0 | 0 | 0 | 0 | 0 | 0 | 0 |

Figure 10B:
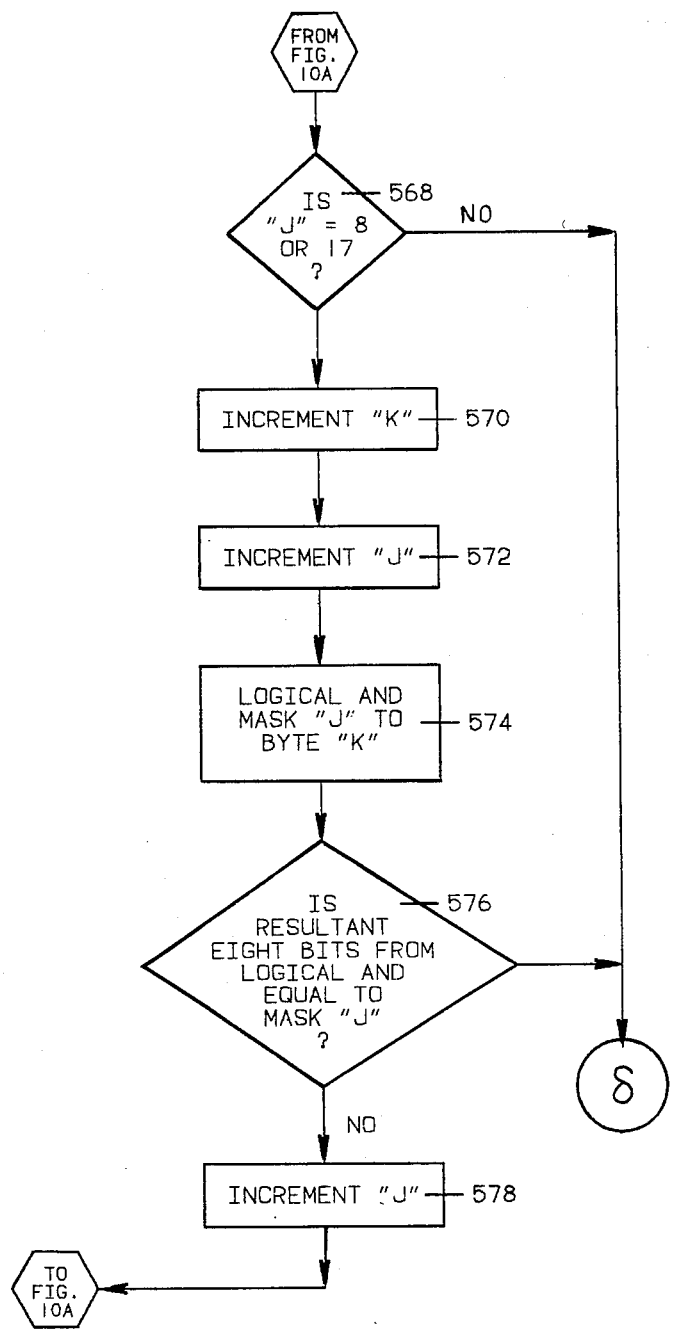

The resulting eight bits from the logical AND operation of step 558 are compared with the eight bit configuration of the particular mask "J" in a step 560. If the eight bits are not identical, the central processor proceeds along a no-path to step 562 and increments "J" by one. The central processor now proceeds to ask whether the thus incremented value of "J" is equal to 9 or 18 in step 564. Referring to the mask table, it is to be appreciated that there are nine separate masks to be applied to each byte. Hence when all nine masks have been applied as indicated in step 564, the central processor will proceed to a step 566 and increment the value of "K". In this regard, the value of "K" will be incremented from one to two when "J" equals nine and will be incremented from two to three when "J" equals eighteen. In this manner, all masks will be applied to bytes 1, 2, and 3 in a reiterative fashion until such time as a positive comparison has been made in step 560. In this event, the central processor will proceed along the yes-path from step 560 to a step 568 in FIG. 10B.

Figure 9D:
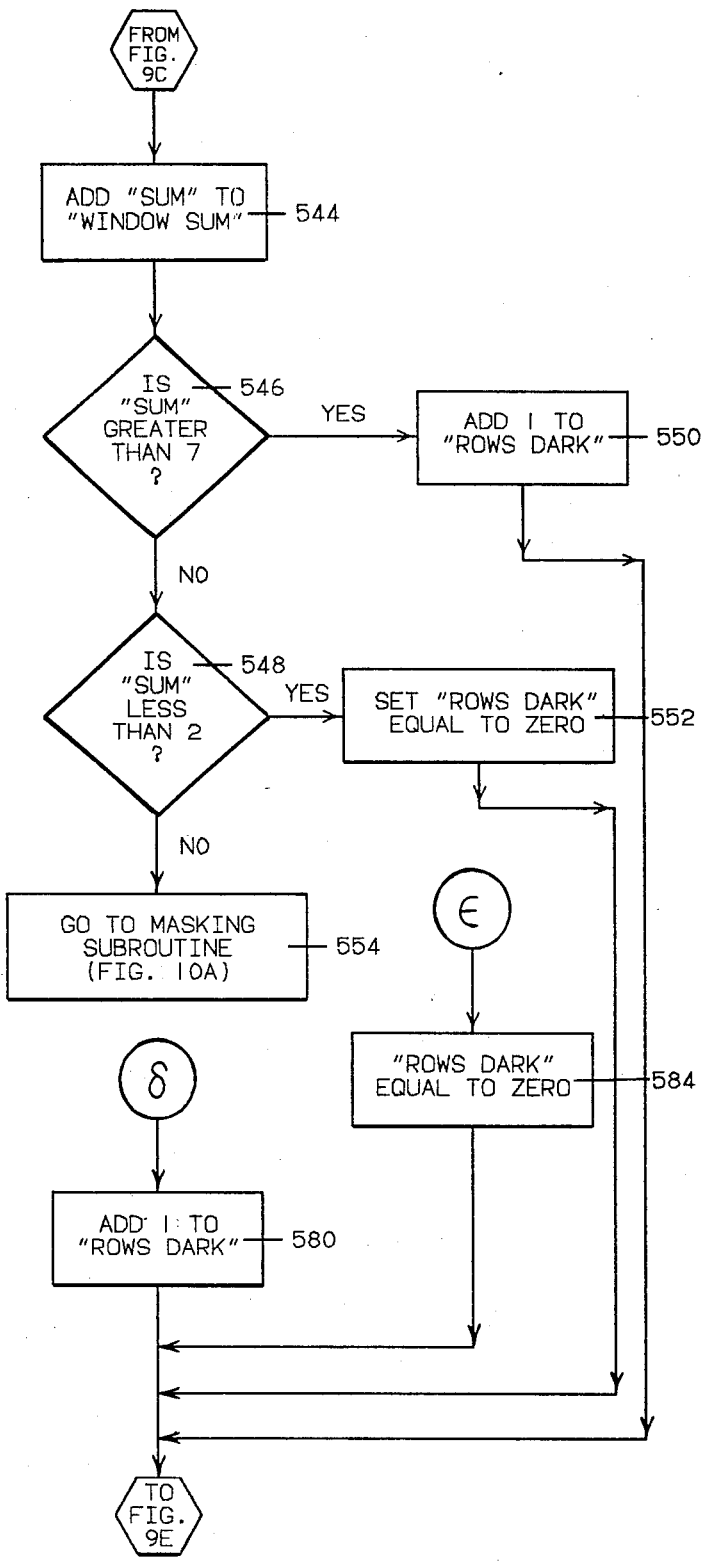

Referring to step 568, the central processor inquires as to whether the value of "J" is equal to eight or seventeen. This inquiry is necessary since the bit mask for these particular values of "J" only verify that the least significant bit of the eight bit byte defined by "K" is a binary one. It therefore becomes necessary to verify whether the most significant bit of the next successive byte is also a binary one. This is accomplished in steps 570 through 576. Specifically, the next successive byte is defined by incrementing the value of "K" in step 570. The bit mask which tests for the most significant bit is then identified by incrementing the value of "J" to either nine or eighteen in step 572. The logical AND of the thus identified mask "J" to the thus identified byte "K" is performed in step 574 and the resultant eight bits are compared to the bit configuration of the mask "J" in step 576. If the most significant bit of the byte is not a binary one, the comparison will be negative. The central processor will hence proceed along the no-path to a step 578 and increment the value of "J". The central processor will then return to step 558 in FIG. 10A where the process begins all over of adding successive bit masks "J" to the thus defined byte "K". Referring again to step 576, if the most significant bit of byte "K" is a binary one, then the central processor will proceed along a yes path to the exit point δ which also marks a re-entry point δ to the image analysis program in FIG. 9D. It is to be noted that the only other path to the re-entry point δ in FIG. 9D is from the step 568 in FIG. 10B. In this regard, a no-path will be pursued out of step 568 in the event that the value of "J" is other than eight or seventeen and the application of the particular "J" mask in steps 558 and 560 have identified two successive binary one bits in the byte under examination. It is therefore to be appreciated that the masking sub-routine returns to the image analysis program via the re-entry point δ only when two successive bits have been identified as binary ones, either as a result of steps 558 and 560 or through the additional steps of 574 and 576. In either case, the central processor will proceed in a step 580 in FIG. 9D to add one to the current value of "rows dark". This means that the particular row of the window under examination is being characterized as having a dark condition.

Referring again to FIG. 10A, in the event that the masking sub-routine proceeds through all "J" masks without finding two successive binary one bits in the bytes defined by "K", then the central processor will proceed out of the masking routine from a step 582 to a re-entry point ε in FIG. 9D. The central processor will now proceed in a step 584 to set "rows dark" equal to zero. This means that the "rows dark" variable will be again set back to zero regardless of the current value of "rows dark". In other words, even though several successive rows of the window may have had at least two successive pixel pits equal to binary one, the "rows dark" variable will still be returned to zero. Following the setting of "rows dark" equal to zero in step 584 or incrementing "rows dark" by one in step 580, the central processor proceeds to a step 586 in FIG. 9E. Referring to step 586, a determination is made as to whether the value of "rows dark" is equal to ten. In the event that "rows dark" is less than ten, the central processor proceeds to step 588 and calculates a new "base address". In this regard, it will be remembered that each row of stored pixel bits will comprise forty eight separately addressable bytes. It is hence necessary to subtract forty eight from the current value of the base address in order to identify the first byte in the immediately adjacent row. The "row count" is thereafter incremented by one in a step 590 so as to maintain a count of the rows which have been successively examined for a given window $W_i$. The central processor now inquires as to whether the thus incremented row count is equal to fifteen in a step 592. In this regard, it will be remembered that a window consists of fifteen rows of binary coded bits. All fifteen rows will have been examined when the "row count" reaches a value of fifteen. In the event that all fifteen rows of the window have not been examined, the central processor will proceed along the no path out of step 592 to a re-entry point γ in FIG. 9A.

Referring to the re-entry point γ, it is to be noted that a new "current address" is calculated in step 518 for the new byte 1 within the next adjacent row of pixel bits. This new byte 1 is accessed from the CIU memory and stored in step 520. In a similar fashion bytes 2 and 3 are accessed and stored in steps 522 and 524. The particular fifteen window bits within the new bytes 1, 2 and 3 will be isolated in steps 526 through 540. The sum of these bits will be computed in step 542 and added to the "window sum" in step 544. The central processor will next proceed to appropriately adjust the "rows dark" variable in steps 546 through 552 for a sum either greater than seven or less than two. The central processor will otherwise execute the masking subroutine of FIGS. 10A and 10B for the purposes of determining whether two successive bits are both binary ones. The "rows dark" variable is thereafter appropriately adjusted in steps 580 or 584 before the central processor again checks on whether the value of "rows dark" is equal to ten in step 586. In the event that the value of "rows dark" does equal ten, the central processor will exit from the reiterative loop of checking successive window rows and proceed to a step 594 in FIG. 9E. Referring to step 594, the central processor will set the window test variable "$F_i$" equal to one indicating that the particular window identified by the subscript "i" has passed. This means that at least ten successive rows within the window have each had at least two successive pixel bits equal to binary one.

Figure 9E:
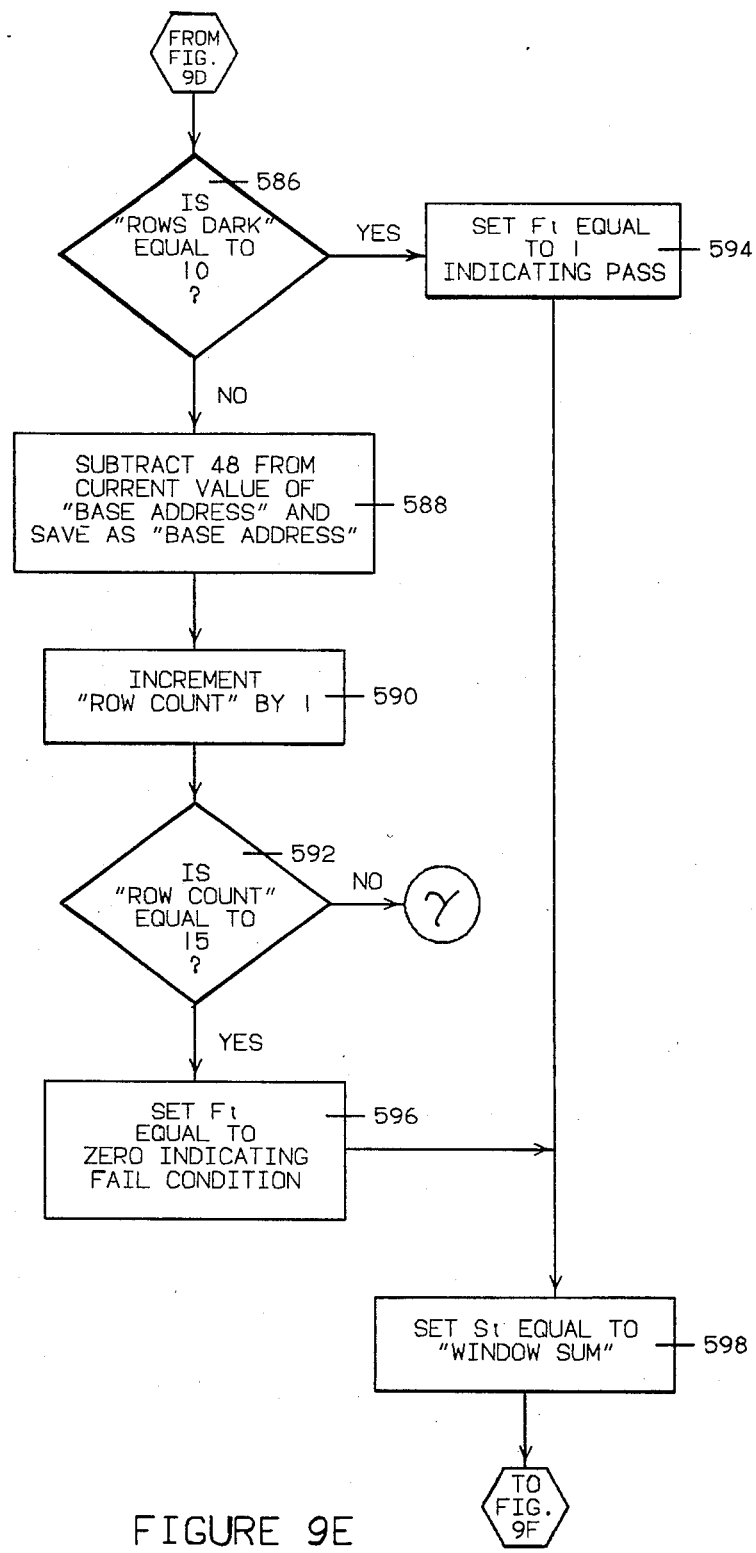

Referring again to step 592 in FIG. 9E, it is to be noted that if all fifteen rows of the window have been examined without the "rows dark" variable totaling ten, then the central processor will proceed to a step 596. The central processor will set the window test variable "$F_i$" identifying the particular window then under examination equal to zero indicating a fail condition. This essentially means that all rows of the window were examined and no ten rows in succession were found to have at least two successive pixel bits equal to binary one.

Following the setting of the window test variable "$F_i$" equal to either one in step 594 or equal to zero in step 596, the central processor will proceed to a step 598 and set "$S_i$" equal to the value of "window sum". The central processor will now proceed to a step 600 in FIG. 9F.

Figure 9F:
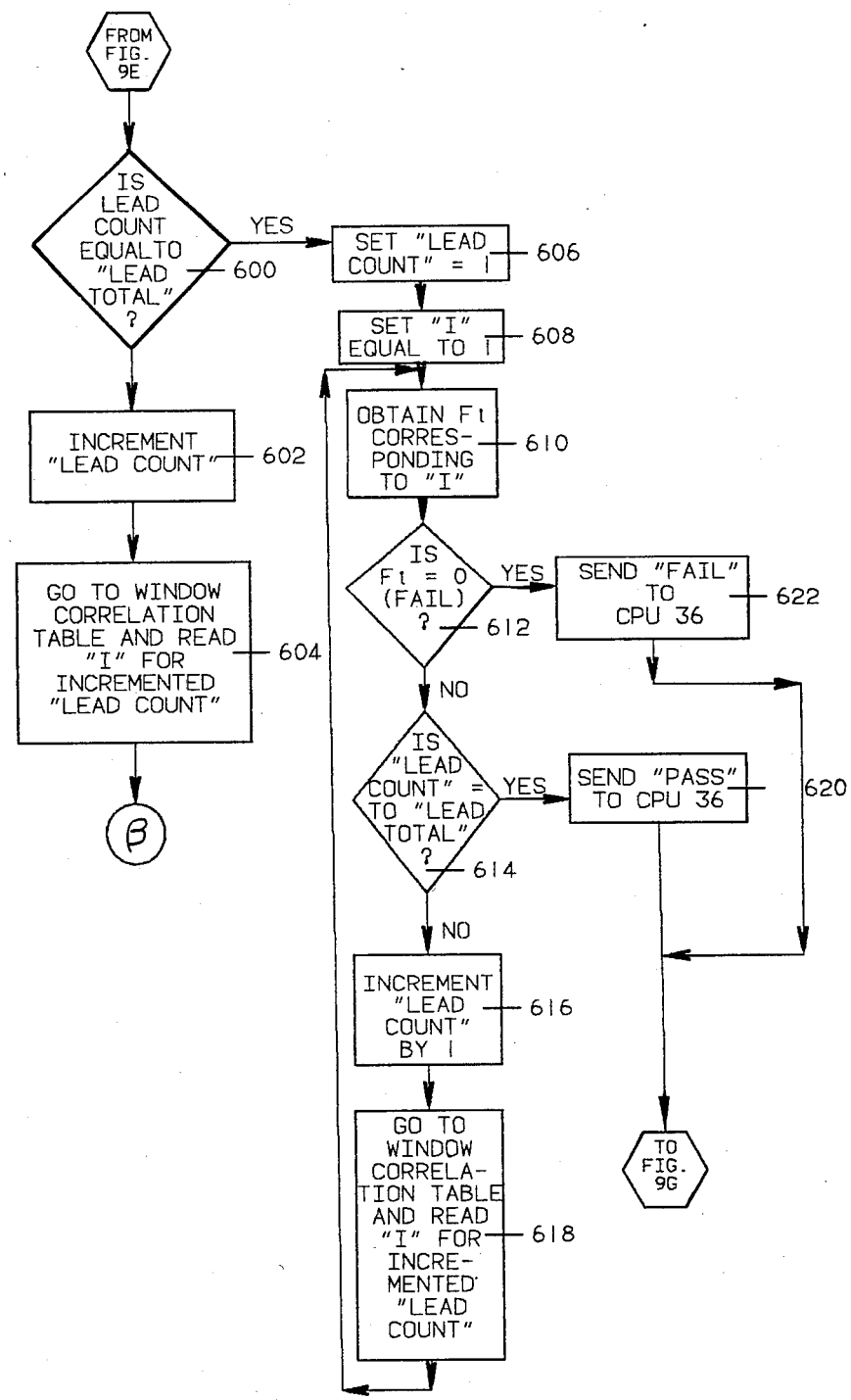

Referring to step 600 in FIG. 9F, the central processor compares the current value of "lead count" to the value of "lead total". In this regard, it. will be remembered that "lead total" is defined in a step 310 as the number of leads for the component that is being inserted. It will also be remembered that the software variable "lead count" is initially set equal to one in a step 507. Since most components will have several leads, the central processor will proceed to increment "lead count" in a step 602. The incremented "lead count" of step 602 will now be used in a step 604 to define the next window which is to be examined for the presence or absence of a lead. In this regard, the central processor will proceed to the window correlation table and read the value of "I" for the incremented "lead count" of step 602. The central processor will now proceed via return point β to FIG. 9A and again initialize the various variables in step 508 necessary to perform an analysis of the next window. The central processor will then proceed to go to the table of $X_i$, $Y_i$ coordinates and obtain the coordinates for "I". These coordinates will be stored in step 512 and the "base address" for the $Y_i$ coordinate will be calculated in step 514. The $X_i$ coordinate will be divided by eight in step 516 and both the dividend "D" and the remainder "R" will be saved. The three bytes within the Yi row will then be identified and the fifteen window bits within these three bytes will be analyzed as has been previously discussed. The "rows dark" will either be incremented or set to zero and the central processor will proceed to the next row of window bits to be analyzed. In the event that ten successive rows of the window under examination contain at least two successive pixel bits having values of binary one, then a lead will be assumed to be present and the window will have a pass condition noted in step 594. The particular window will otherwise have a fail condition noted in step 596 for the window test variable "$F_i$" identifying that particular window. The central processor will continue through the above steps until such time as the "lead count" equals "lead total" in step 600. At this time, the central processor will proceed to a step 606 in FIG. 9F and again set the software variable "lead count" equal to one. The central processor then proceeds to set "I" equal to one in a step 608 and obtains the particular "$F_i$" corresponding to the value of "I" in step 610. The value of the thus obtained $F_i$ is checked for a failure condition in a step 612. In the event that the currently examined "$F_i$" has a value of zero, the central processor will immediately exit to a step 622 and transmit a "fail" signal to central processor 36. On the other hand, if a given $F_i$ is equal to one, the central processor will proceed to a step 614 and check as to whether "lead count" equals "lead total". In the event that the "lead count" remains less than "lead total", the central processor will proceed to increment the "lead count" in a step 616 and read the current value of "I" for the incremented "lead count" in step 618. The "$F_i$" corresponding to the thus incremented value of "I" will be obtained in step 610 and analyzed as to failure in step 612. This will continue to occur until such time as a particular "F_i" is equal to zero or until the "lead count" is equal to "lead total". In the latter event, the central processor will exit from step 614 to a step 620 and send a "pass" message to the central processor 36.

Figure 9G:
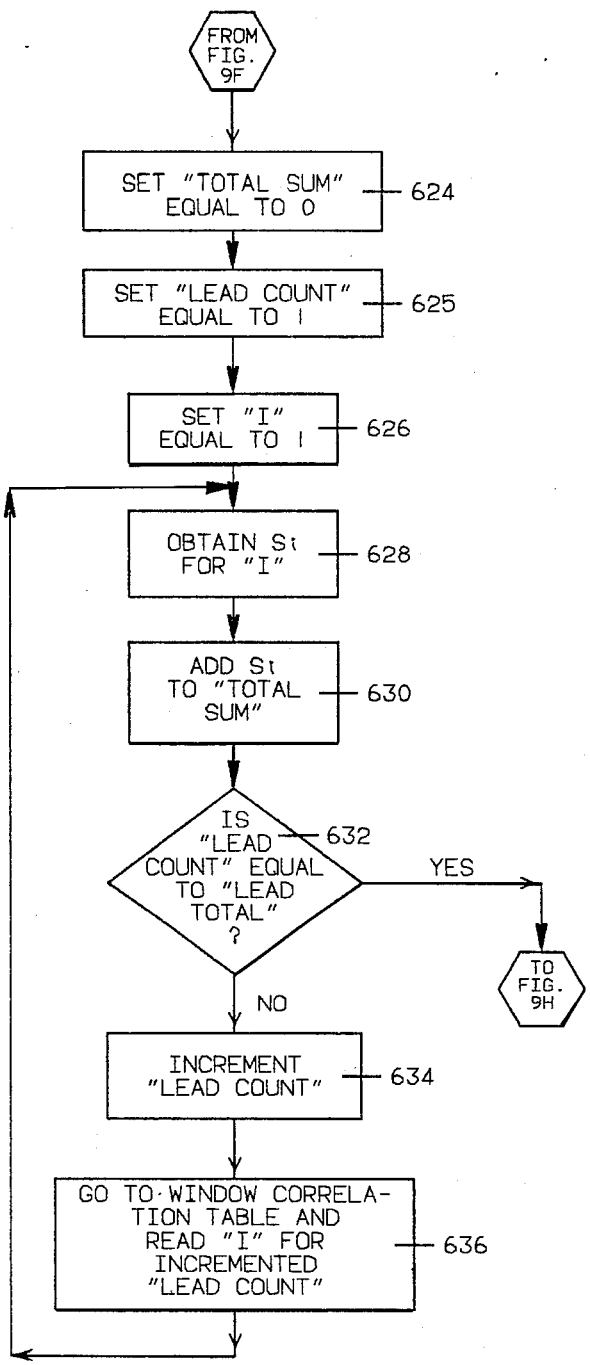
Figure 9H:
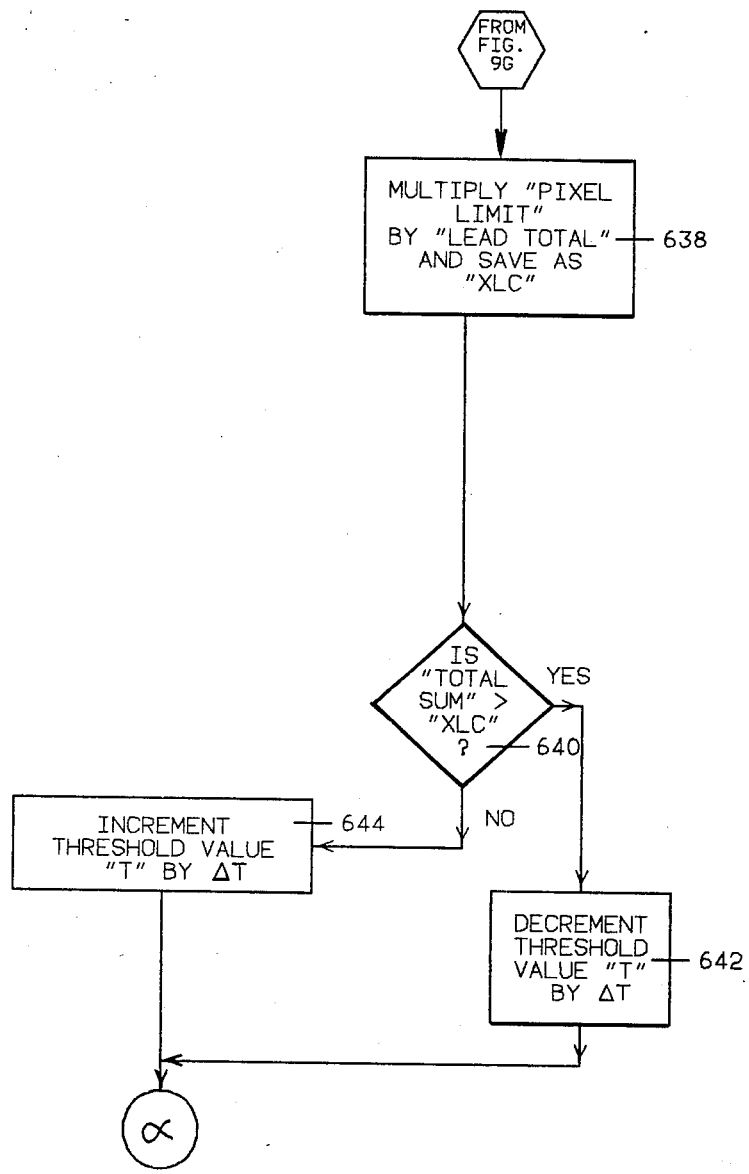

Following the transmission of either a "pass" or "fail" message to central processor unit 36 via step 620 or 622, the central processor 38 will proceed to adjust the threshold value in FIG. 9G. In this regard, it will be remembered that the CIU 50 is initially set at a predefined threshold value which is thereafter used to arbitrally assign dark versus light significance to the analog voltage value from the video camera 24. This threshold value is continuously updated by the central processor unit 38 in a manner which will now be explained. Referring to FIG. 9G, the central processor sets a software variable "total sum" equal to zero in a step 624. The central processor now proceeds to set "lead count" equal to one in a step 625. The window index variable "I" is also set equal to one in a step 626. The central processor now proceeds to obtain an "$S_i$" for the thus indicated value of "I". It will be remembered that "$S_i$" for a given window represents the total count of binary ones for that window either prior to a determination as to a lead being present or after all fifteen rows of the window have been analyzed without a lead having been determined to be present. The value of the thus obtained "$S_i$" is added to "total sum" in a step 630. The central processor proceeds to a comparison step 632 and inquires as to whether the current value of "lead count" equals "lead total". In the event that the answer is no, the central processor proceeds to a step 634 and increments "lead count". The value of "I" for the thus incremented "lead count" is obtained from the window correlation table in step 636. The central processor now proceeds back to step 628 and obtains the "$S_i$" for the current value of the window index variable "I". This process of obtaining an "$S_i$" for an incremented "I" and thereafter adding "$S_i$" to "total sum" continues until such time as "lead count" equals "lead total". At this time, the central processor exits from the step 632 to a step 638 in FIG. 9H. Referring to step 638, the value of "lead total" is multiplied by "pixel limit" and saved as "XLC". It will be remembered that the software variable "pixel limit" defines an average number of binary one bits per window that is not to be exceeded for a given component. The value of "XLC" therefore indicates the maximum count of binary one bits for all windows that have been investigated for the particular component having a particular "lead total". The central processor proceeds to a step 640 and compares the value of "total sum" to that of the maximum allowable number of binary ones, "XLC" calculated for the given component. In the event that the value of "total sum" exceeds "XLC" the central processor proceeds to a step 642 and decrements the threshold value "T" by a predetermined amount of $\Delta T$. In other words, the central processor has determined via step 640 that the threshold value has been set too high so as to cause the CIU 50 to possibly define too many pixels as dark. On the other hand, if the value of "total sum" is equal to or less than the maximum permissible limit, "XLC", then the central processor proceeds to a step 644 and increments the threshold value "T" by the predetermined amount of $\Delta T$. This causes the CIU 50 to slightly change its interpretation of what is a dark condition from the camera 24. In this regard, the tendency to characterize a given pixel as dark will increase slightly in this latter case. It is to be noted that the incrementing or decrementing of the threshold value "T" by the amount $\Delta T$ should not cause wide adjustments to the threshold value at any one time. Accordingly, the amount of $\Delta T$ should preferably be defined within the image analysis program as approximately one percent of the initial value of the threshold value that is initially read into the program in step 302. Following either the incrementing or decrementing of the threshold value in steps 644 or 642, the central processor proceeds back to a return point $\alpha$ in FIG. 7B. At this time, if the component insertion machine is in a normal mode of inserting components, then a picture authorization signal will be received in a step 308 and the image analysis process will proceed via step 310 and the operating program of FIGS. 9A through 9H will take place.

It is also of course to be noted that in the event that the operator wishes to adjust or otherwise change the currently displayed window locations, then a keyboard entry on the terminal 60 will prompt the central processor to proceed to the diagnostic program via steps 314 and 316. As has been previously discussed, the diagnostic program can move one window, a row of windows, or the entire array of windows.

It is to be noted that a preferred embodiment of an image analysis system for analyzing the inserted leads of a component within a component insertion machine has been disclosed. Various portions of this system including the computer programs residing therein may be changed without departing from the scope of the present invention.

What is claimed is:

1. A machine for inserting electronic components, such as dip components, having a pair of rows of parallel leads, running from one end of a component to the other end and defining the sides of the component, into holes of a printed circuit board comprising:

means for inserting the parallel leads of a component into holes of the printed circuit board so that the leads extend beyond the bottom surface of the printed circuit board, camera means, means for mounting said camera means on one side of the leads at an angle to the rows of parallel leads selected so that said camera means will see the leads of one row spaced from the leads of the other row, means for making each of the leads extending beyond the bottom surface of the printed circuit board appear dark to said camera means with the rest of the image seen by the camera appearing light including light source means and means for mounting said light source means at the opposite side of the leads to direct light toward the bottom surface of the printed circuit board proximate the leads so that it will reflect towards said camera means thereby presenting to said camera means a pattern of dark spots corresponding to the leads extending beyond the printed circuit board, and means for comparing the pattern of dark spots seen by said camera means with the pattern which the camera would see if all the leads were present in the inserted component and stopping said machine if the patterns do not match.

2. A machine according to claim 1 wherein said mounting means mounts said camera means at an angle to the bottom surface of the printed circuit board selected so that said camera means will see one row of the leads above and spaced from the other row of leads.

3. A machine according to claim 2 wherein said mounting means mounts said camera means at an angle of about 25° to the bottom surface of the printed circuit board.

4. A machine according to claim 2 further comprising means for supporting the bottom surface of the printed circuit board, said supporting means being selectively configured not to block the path of light from said light source means to the bottom surface of the printed circuit board and reflected therefrom to said camera means.

5. A machine according to claim 4 further comprising means for displacing said supporting means between an elevated support position and a lowered position.

6. A system for verifying the proper insertion of a row of leads of an electronic component such as a DIP into a printed circuit board prior to securing the leads to the board comprising:
  means for backlighting the row of inserted leads of an inserted component so that the inserted leads will appear dark from the front thereof,
  camera means including a plurality of photosensitive binary elements arranged in horizontal rows to define a two-dimensional array, such elements having a one value when the image sensed is dark and having a zero value when the image sensed is light,
  means for mounting said camera means in front of the row of inserted leads and at a distance therefrom selected so that each backlit lead, which will occupy an area at least six photosensitive elements wide by about fifteen photosensitive elements high, will be located within a discrete window of photosensitive elements defined by about fifteen consecutive horizontally spaced rows of such photosensitive elements each row having about fifteen photosensitive elements,
  means for determining whether about any two consecutive photosensitive elements in each of about ten consecutive rows within each of said windows have said one value, and
  means for indicating that all leads are present in the event said determining means so determines.

7. A system according to claim 6 wherein the electronic component has two rows of leads and said mounting means comprises means for mounting said camera means so that each of the leads of the two rows of leads will be located within a discrete window of photosensitive elements.

8. A system according to claim 7 wherein said mounting means comprises means for mounting said camera means at about a 25° angle with the bottom surface of the printed circuit board through which the leads have been inserted.

9. A system according to claim 8 wherein said determining means comprises:
  means for summing the one value of each of said photosensitive elements in a row within a window.

10. A system according to claim 9 wherein said determining means further comprises means for successively applying two bit masks to the values of photosensitive elements of a row within a window.

11. A system according to claim 10 further comprising:
  means for displaying the image seen by said camera means, and
  means for outlining said discrete windows on said displaying means so that the proper location of said discrete windows can be confirmed.

* * * * *